US006785391B1

(12) United States Patent
Emura et al.

(10) Patent No.: US 6,785,391 B1
(45) Date of Patent: Aug. 31, 2004

(54) APPARATUS AND METHOD FOR SIMULTANEOUS ESTIMATION OF TRANSFER CHARACTERISTICS OF MULTIPLE LINEAR TRANSMISSION PATHS

(75) Inventors: Satoru Emura, Tokyo (JP); Masato Miyoshi, Tokyo (JP)

(73) Assignee: Nippon Telegraph and Telephone Corporation (JP)

(*) Notice: Subject to any disclaimer, the term of this patent is extended or adjusted under 35 U.S.C. 154(b) by 0 days.

(21) Appl. No.: 09/316,358

(22) Filed: May 21, 1999

(30) Foreign Application Priority Data

May 22, 1998 (JP) .......................................... 10/141505

(51) Int. Cl.[7] .......................... H03G 3/00; H04R 29/00
(52) U.S. Cl. .............................. 381/61; 381/56; 381/63
(58) Field of Search ............................ 381/56, 61, 63, 381/62, 71.1; 708/322

(56) References Cited

U.S. PATENT DOCUMENTS 5,661,813 A * 8/1997 Shimauchi et al. ........... 381/66
5,761,318 A * 6/1998 Shimauchi et al. ........... 381/66

FOREIGN PATENT DOCUMENTS

JP 9-312597 12/1997

OTHER PUBLICATIONS

Emura, Satoru, et al., "Precise Estimation of Multiple Transmission Paths in a Linear System", *Technical Report of IEICE*, EA98–62, The Institute of Electronics, Information and Communication Engineers, Sep. 1998, pp. 25–32.

Sondhi, M.M., et al., "Stereophonic Acoustic Echo Cancellation—An Overview of the Fundamental Problem," *IEEE Signal Processing Letters*, vol. 2, No. 8, Aug. 1995, pp. 148–151.

* cited by examiner

*Primary Examiner*—Forester W Isen
*Assistant Examiner*—Elizabeth McChesney
(74) *Attorney, Agent, or Firm*—Connolly, Bove, Lodge & Hutz LLP

(57) ABSTRACT

N correlated signals are processed by N pre-filters whose transfer characteristics have different zero points, then the processed signals are input into an N-input M-output linear FIR system, and its transfer characteristics are estimated from its response outputs and the processed signals from the pre-filters.

21 Claims, 11 Drawing Sheets

APPARATUS AND METHOD FOR SIMULTANEOUS ESTIMATION OF TRANSFER CHARACTERISTICS OF MULTIPLE LINEAR TRANSMISSION PATHS

BACKGROUND OF THE INVENTION

The present invention relates to an apparatus and method for simultaneous estimation of N×M signal transmission paths of an N-input M-output linear FIR system (where N=2,3, . . . and M=1,2, . . . ) such as a structure provided with pluralities of sensors and actuators and a multi-loudspeaker multi-microphone system. The invention also pertains to a recording medium with the method recorded thereon.

With recent developments in the technology of digital processing and speedups of arithmetic processing, acoustic signal processing such as sound pressure control and active noise control, originally intended for use in a single-input single-output system, is now going into use in a multi-input multi-output system. With such signal processing, the multi-input multi-output system is supplied with signals that have passed through a control filter. Since the control filter has its coefficients computed from the characteristics of the multi-input multi-output system, an exact extraction or identification of the system characteristic is needed.

A possible example of an application of such acoustic signal processing is a home theater, which is an extension of a conventional two-channel stereophonic reproduction system to a multichannel system using four or six loudspeakers. In the implementation of a sound system closer to that of a movie theater, it is necessary to identify transfer characteristics of multiple transmission paths in the listening room so as to adjust the control filter for acoustic signal processing use accordingly.

In an N-input M-output linear system it is conventional to derive transfer characteristics of N×M signal transmission paths by dividing N one-input M-output subsystems and estimating the transfer function of each subsystem through calculation of the correlation between the input signal and each of M output signals. With this method, the transfer functions of the N subsystems are determined not simultaneously, but one after another. An example of this method is disclosed in Japanese Patent Application Laid-Open Gazette No. 131003/91, according to which transfer functions of a multi-input multi-output system for modeling characteristics of a chemical plant are estimated one after another to thereby reduce the degree of an identification model. With this known method, response signals are measured at a plurality of output ends upon each application of a test signal to one of input ends; no signals are applied to the other input ends at the same time. Since all of the transfer functions of the system can not be measured simultaneously, it is necessary to repeat measurements of response signals at the plurality of output ends for the input signal that is applied to each of the input ends.

As a solution to this problem, there is suggested in U.S. Pat. No. 5,661,813 a method for simultaneous estimation of all transfer functions by adding input signals with uncorrelated variations, or inputting N uncorrelated estimated or pseudo noise signals. The estimation of transfer characteristics of the N-input M-output linear system consumes much time because it is necessary to make sure, for all of N×(N−1)/2 combinations of input signals, that the input signals are sufficiently uncorrelated. In addition, when a set of highly correlated input signals is found, it is necessary to uncorrelate the set of input signals by adding thereto different variations, in which case, however, the other sets of input signals need to be checked again for correlation.

When the N-input M-output linear system is driven by an identical signal or highly correlated signals, it is impossible with the prior art to guarantee identification of the transfer characteristics of the N×M multiple transmission paths. Such a situation is encountered, for example, in a multi-input echo canceller of a multi-channel teleconferencing system. In the multi-channel teleconferencing system, speech of one talker picked up by a plurality of microphones at a remote place is transmitted as multi-channel signals from the sending side, and at the receiving side the signals are received and the speech is reproduced by multi-loudspeakers in an acoustic space where multi-microphones for sending use are placed. Because of a strong correlation between multi-channel signals generated by the same loud speaker, it is not usually guaranteed that the estimated transfer functions of the transmission paths between the multi-loudspeakers and the multi-microphones at the receiving side always coincide with the actual transfer functions even if residual echoes are cancelled.

SUMMARY OF THE INVENTION

It is therefore an object of the present invention to provide an apparatus and method which permit simultaneous estimation of transfer characteristics of multiple linear transmission paths irrespective of the correlation between simultaneous input signals thereto and hence avoids the necessity for checking their correlation, and a recording medium with the method recorded thereon.

According to the present invention, in simultaneous estimation of transfer characteristics of N×M transmission paths of a linear FIR system defined by its N input points and M output points therebetween, N being an integer equal to or greater than 2 and M an integer equal to or greater than 1, N-channel input signals are processed by N pre-filters of different zero points to generate N-channel preprocessed signals, which are applied via N actuators to the N input points of the linear FIR system, respectively, then response signals from the linear FIR system are detected by M sensors at the M output points, and the transfer characteristics of N×M transmission paths are estimated from the N-channel preprocessed signals and the response signals detected at the M output points.

Thus, the present invention allows simultaneous and separate estimation of transfer characteristics of N×M multiple transmission paths from a variety of input signals.

DETAILED DESCRIPTION OF THE PREFERRED EMBODIMENT

Principle of the Invention

Figure 1:
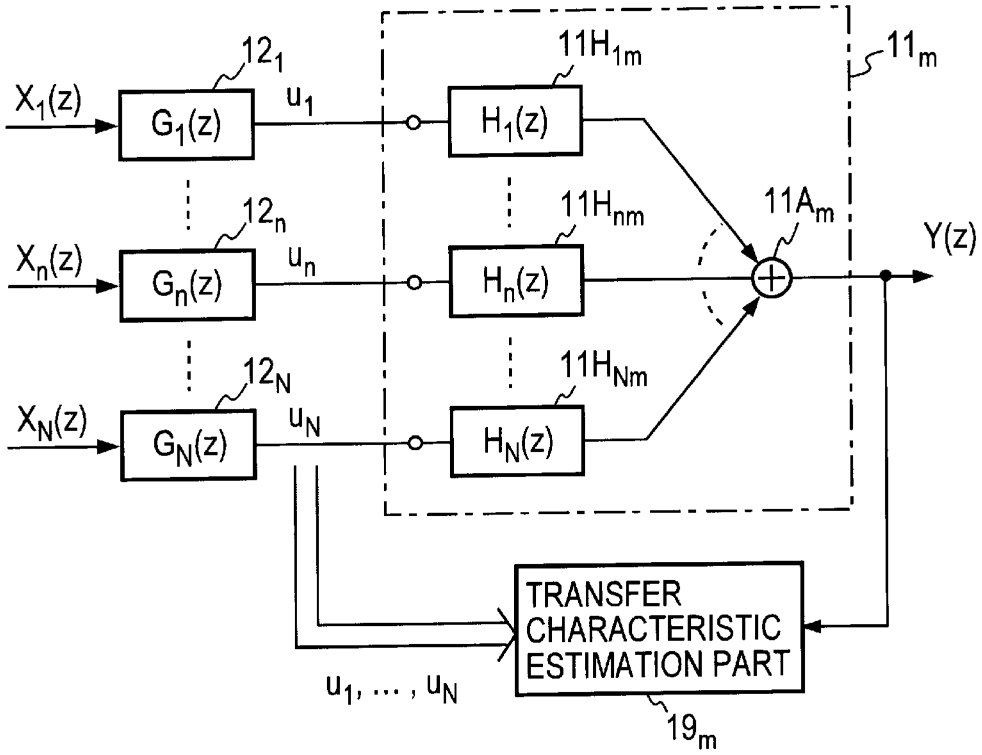
FIG. 1 is a system block diagram for explaining the principle of the present invention.

The present invention employs a configuration wherein N pre-filters of different zeros are placed at stages preceding respective input points of an N-input M-output linear FIR (Finite Impulse Response) system. This configuration permits simultaneous estimation of the N×M multiple transmission paths from various kinds of input signals. The transfer characteristics of a linear FIR system can be expressed by a z-polynomial, which will also be referred to herein as a transfer function.

Since the N-input M-output linear FIR system can be handled as M sets of N-input single-output systems, a description will be given, with reference to FIG. 1, of a transfer characteristic measuring apparatus for the N-input single-output linear FIR system. An unknown N-input single-output linear FIR system $\mathbf{11}_m$ is expressed by N transmission paths $\mathbf{11H}_{1m}, \ldots, \mathbf{11H}_{Nm}$ whose transfer characteristics are $H_1(z), \ldots, H_N(z)$, respectively, and an adder $\mathbf{11A}_m$ which adds together the outputs from these transmission paths. N input points $\mathbf{11S}_1, \ldots, \mathbf{11S}_N$ represent N input means for the unknown system $\mathbf{11}_m$, and the adder $\mathbf{11A}_m$ constitutes output means for taking out the output from the unknown system $\mathbf{11}_m$. For example, if the system $\mathbf{11}_m$ is an acoustic hall (a sound field in a room), then the input points $\mathbf{11S}_1, \ldots, \mathbf{11S}_N$ and the adder 11Am are loudspeakers and a microphone, respectively; in general, they might be actuators and a sensor in a given unknown system.

Reference characters $X_1(z), \ldots, X_N(z)$ are z-transformations of input signals $x_1(k), \ldots, x_N(k)$, and Y(z) a z-transformation of an output signal y(k). Reference characters $G_1(z), \ldots, G_N(z)$ denote transfer characteristics of pre-filters $\mathbf{12}_1, \ldots, \mathbf{12}_N$, and $H_1(z), \ldots, H_N(z)$ transfer characteristics of transmission paths from the input points $\mathbf{11S}_1, \ldots, \mathbf{11S}_N$ of the unknown system $\mathbf{11}_m$ to the adder $\mathbf{11A}_m$ that is the output point of the system. The input/output relation of this system is given by the following equation using z transformation:

$$Y(z)=X(z)\{G_1(z)H_1(z)+\ldots+G_N(z)H_N(z)\} \tag{1}$$

In this case, if (a): the degrees of $G_1(z), \ldots, G_N(z)$ are all higher than N−1 times the degrees of $H_1(z), \ldots, H_N(z)$, and (b): $G_1(z), \ldots, G_N(z)$ have different zeros, there exists only one set of $H_1(z), \ldots, H_N(z)$ that satisfy Eq. (1). This means that the N transmission paths of the N-input single-output linear FIR system are uniquely estimated or identified by inputting thereinto preprocessed signals which are output signals of the pre-filters. That the zeros of the transfer characteristics $G_1(z), \ldots, G_N(z)$ of the pre-filters 121, . . . , 12N are all different means that, letting the degree of each filter be represented by P and its transfer characteristic be expressed by the following equation $$G_n(z)=\prod_{p=1}^{P}(a_{np}-z)\quad(n=1,\ldots,N) \tag{2}$$

the value $a_{np}$ differs for (n,p) of all sets of transfer characteristics of the transmission paths. In other words, it means that these transfer characteristics $G(z), \ldots, G_N(z)$ are mutually prime.

According to the present invention, even if correlated signal are used as the input signals $X_1(z), \ldots, X_N(z)$ of the N channels, the transfer characteristics $H_n(z)$ of transmission paths from the input points $\mathbf{11S}_n$ to the M output points $\mathbf{11A}_m$(where m=1, . . . , M) can uniquely be determined by designing the pre-filters $\mathbf{12}_1, \ldots, \mathbf{12}_N$ to have different zero points. A transfer characteristic estimation part $\mathbf{19}_m$ estimates the transfer characteristics (or impulse responses) of the respective transmission paths from preprocessed signals $U_1(z)=X_1(z)G_1(z), \ldots, U_N(z)=X_N(z)G_N(z)$ for input into the input points $\mathbf{11S}_1, \ldots, \mathbf{11S}_N$ and the output signal Y(z). Various known methods can be used to estimate the transfer characteristics. Such known methods are introduced, for example, in U.S. Pat. Nos. 5,272,695 and 5,408,530.

A description will be given of two typical models of a system that generates correlated input signals $X_1(z), \ldots, X_N(z)$. The first example is a correlated signal generating model depicted in FIG. 2. For example, one loudspeaker 18S and a plurality N of microphones are disposed in a common sound field (for example, in an acoustic hall) 18. A speech signal V(z) from a talker, i.e. from a sound source 17, reproduced by the loudspeaker 18S, is picked up by the plurality N of microphones $\mathbf{18A}_1, \ldots, \mathbf{18A}_N$, whose outputs are provided as the correlated signals $X_1(z), \ldots, X_N(z)$. The speech signal V(z) from the same sound source 17, reproduced by the loudspeaker 18S, passes through acoustic paths $\mathbf{18}_1, \ldots, \mathbf{18}_N$ whose transfer characteristics are represented by $F_1(z), \ldots, F_N(z)$ and are provided therefrom as the correlated signals $X_1(z), \ldots, X_N(z)$, which are applied to the pre-filters $\mathbf{12}_1, \ldots, \mathbf{12}_N$ of the system shown in FIG. 1.

Figure 2:
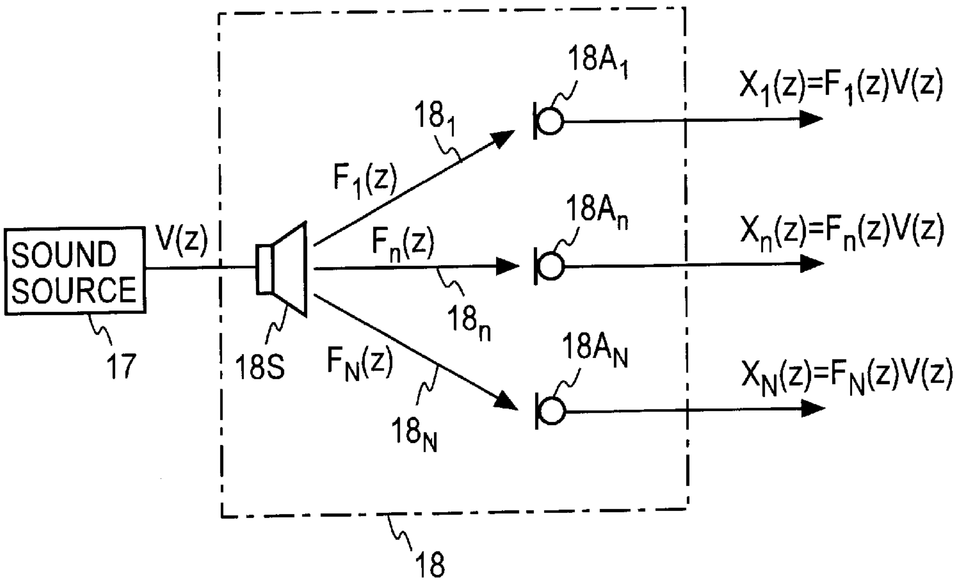
FIG. 2 is a schematic diagram depicting an example of a model that generates from a single sound source a plurality of correlated signals which are input into the system shown in FIG. 1.

In the case of FIG. 2, the generation of the correlated signals $X_1(z), X_N(z)$ can be modeled as the result, $F_n(z)V(z)$, of processing of the single signal source V(z) by a single-input N-output linear filter $F_n(z)$ (where n=1, . . . , N).

Combining this model with the system of FIG. 1, the input/output relation is expressed by the following equation using the z-transformation:

$$Y(z)=V(z)\{G_1(z)F_1(z)H_1(z)+\ldots+G_N(z)F_N(z)H_N(z)\} \tag{3}$$

If the following conditions $$\deg G_n(z)F_n(z)>(N-1)\deg H_1(z),(N-1)\deg H_2(z),\ldots,(N-1)\deg H_N(z) \tag{4a}$$

$$GCD\{G\mathbf{1}(z)F_1(z),G_2(z)F_2(z),\ldots,G_N(z)F_N(z)\}=1 \tag{4b}$$

are satisfied, the N transmission paths of the N-input single-output linear FIR system 11$_m$ are uniquely determined as is the case with the application of the identical signal in FIG. 1. In the above, deg F(z) represents the degrees of z-polynomials F(z), and GCD($G_1$(z), $G_2$(z)) represents the greatest common polynomial of z-polynomials $G_1$(z) and $G_2$(z).

Figure 3:
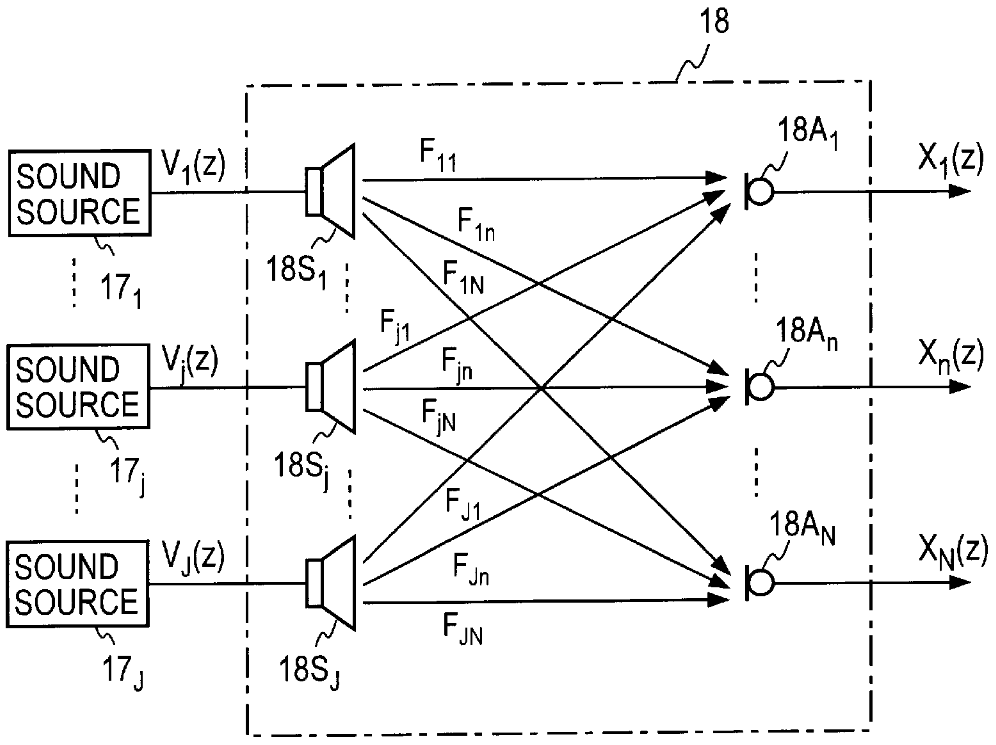
FIG. 3 is a schematic diagram showing a model that generates a plurality of correlated signals from a plurality of sound sources.

The second example is a correlated signal generating model depicted in FIG. 3. In this model, speech signals (uncorrelated) from a plurality (J) of speakers, reproduced by a plurality (J) of loudspeakers 18$S_1$, . . . , 18$S_J$, are picked up by the plurality (N) of microphones 18$A_1$, . . . , 18$A_N$ in the common sound field 18, and the microphone outputs are used as the correlated signals $X_1$(z), . . . , $X_N$(z). In this instance, since speech signals $V_1$(z), . . . , $V_J$(z) from the J speakers, that is, from sound sources 17$_1$, . . . , 17$_J$, are all picked up by each of the N microphones, J×N transmission paths are defined by the J sound sources 17$_1$, . . . , 17$_J$ and the N microphones 18$A_1$, . . . , 18$A_N$ between them. In FIG. 3 the transmission characteristics of these J×N transmission paths are expressed as follows:

$F_{11}$(z), $F_{12}$(z), . . . , $F_{1N}$(z),
$F_{21}$(z), $F_{22}$(z), . . . , $F_{2N}$(z),
. . . ,
$F_{J-11}$(z), $F_{J-12}$(z), . . . , $F_{J-1N}$(z),
$F_{J1}$(z), $F_{J2}$(z), . . . , $F_{JN}$(z).

By handling this J-input N-output system as N sets of J-input single-output system, this correlated signal generating model can be modeled by the following equation that is the results of processing of the N sets of systems by a J-input single-output linear filter $F_{jn}$(z) (where j=1, . . . , J and n=1, . . . , N) which is supplied with the signals $V_1$(z), . . . , $V_J$(z) from the J sound sources $$X_n(z)=\sum_{j=1}^{J}F_{jn}(z)V_j(z)\ (n=1,\ldots,N) \tag{5}$$

In the model of FIG. 3 wherein highly correlated input signals are provided from a plurality of sound sources, highly correlated signals $X_n$(z) (where n=1, . . . , N) that are derived from the J sufficiently wide-band and independent signals $V_J$(z) (where j=1, . . . , J) are modeled as expressed by Eq. (5). By describing in terms of row vector the N signals $X_n$(z) (where n=1, . . . , N) that are z-transformations of the highly correlated signals, the relationship between the highly correlated signals $X_n$(z) and the J sound source signals $V_J$(z) is given as follows:

$$\begin{aligned}[X_1(z),X_2(z),\ldots,X_N(z)]&=\left[\sum_{j=1}^{J}F_{j1}(z)V_j(z),\ \sum_{j=1}^{J}F_{j2}(z)V_j(z),\ \ldots,\ \sum_{j=1}^{J}F_{jN}(z)V_j(z)\right]\\&=[V_1(z),V_2(z),\ldots,V_J(z)]\begin{bmatrix}F_{11}(z)&F_{12}(z)&\ldots&F_{1N}(z)\\F_{21}(z)&F_{22}(z)&&F_{2N}(z)\\\vdots&&\ddots&\vdots\\F_{J1}(z)&\ldots&\ldots&F_{JN}(z)\end{bmatrix}\end{aligned} \tag{6}$$

Figure 4:
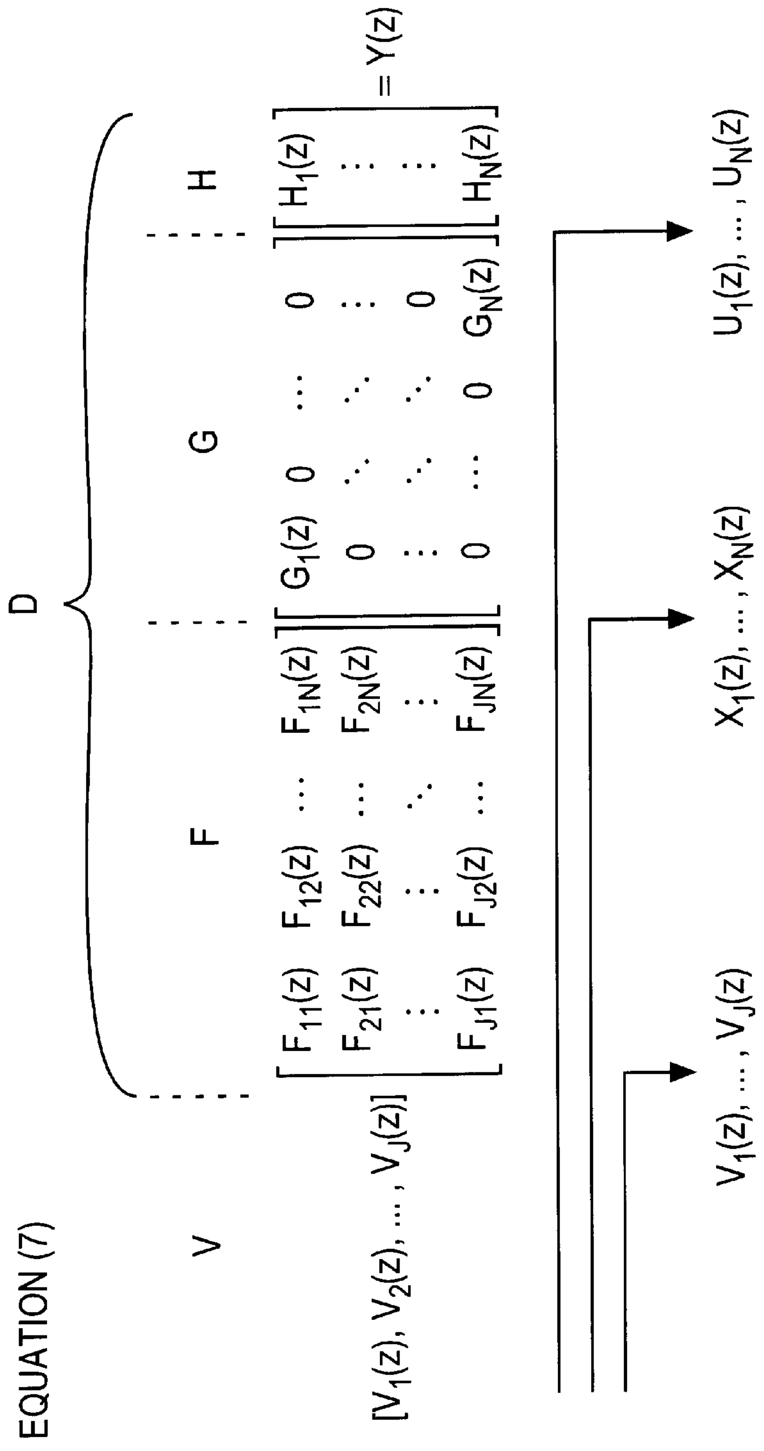
FIG. 4 a diagram for explaining an equation that represents the input/output relationship when the FIG. 3 model is connected to the FIG. 1 system.

Accordingly, when the model of FIG. 3 is connected to the system of FIG. 1, the relationship between the input signals from the J sound sources 17$_1$, . . . , 17$_J$ and the output signal from the microphone (that is, the adder) 11$A_m$ which is the output end of the N-input M-output linear FIR system 11 is expressed by Eq. (7) depicted in FIG. 4.

For accurate estimation of the actual transfer characteristics $H_1$(z), . . . , $H_N$(z) from the signal input/output relationship, it is necessary that there exists only one set of $H_1$(z), . . . , $H_N$(z) that satisfy the above equation (7). In the presence of two or more such sets, the transfer characteristics $H_1$(z), . . . , $H_N$(z) derived from the relationship between input and output signals do not always agree with true transfer characteristics. Hence, an examination needs to be made of the conditions for deriving the transfer characteristics $H_1$(z), . . . , $H_N$(z) from Eq. (7).

Now, virtual transfer functions $D_1$(z), . . . , $D_J$(z) are defined using the following equation.

$$\begin{bmatrix}D_1(z)\\\vdots\\\vdots\\D_J(z)\end{bmatrix}=\begin{bmatrix}F_{11}(z)&F_{12}(z)&\ldots&F_{1N}(z)\\F_{21}(z)&F_{22}(z)&&F_{2N}(z)\\\vdots&&\ddots&F_{2N}(z)\\F_{J1}(z)&\ldots&\ldots&F_{JN}(z)\end{bmatrix}\begin{bmatrix}G_1(z)&0&\ldots&0\\0&\ddots&&\vdots\\\vdots&&\ddots&o\\0&\ldots&0&G_N(z)\end{bmatrix}\begin{bmatrix}H_1(z)\\\vdots\\\vdots\\H_N(z)\end{bmatrix} \tag{8}$$

Using the above equation, Eq. (7) of FIG. 4 can be rewritten as $$[V_1(z),V_2(z),\ldots,V_J(z)]\begin{bmatrix}D_1(z)\\\vdots\\\vdots\\D_J(z)\end{bmatrix}=Y(z) \tag{9}$$

Assume that a plurality J of signals for generating highly correlated signals are sufficiently wide-band and independent. In this case, it is guaranteed by the digital signal processing theory that the abovesaid transfer functions $D_1$(z), . . . , $D_J$(z) are obtained uniquely.

Further, Eq. (8) can be rewritten as $$\begin{bmatrix} D_1(z) \\ \vdots \\ \vdots \\ D_J(z) \end{bmatrix} = \begin{bmatrix} F_{11}(z)G_1(z)H_1(z) + F_{12}(z)G_2(z)H_2(z) + \ldots + F_{1N}(z)G_N(z)H_N(z) \\ \vdots \\ \vdots \\ F_{J1}(z)G_1(z)H_1(z) + F_{J2}(z)G_2(z)H_2(z) + \ldots + F_{JN}(z)G_N(z)H_N(z) \end{bmatrix}$$

In Eq. (10), sets of J corresponding elements of column vectors on the right and left sides represents J equations. These equations are of the same form as that of Eq. (3). Accordingly, as is the case with Eqs. (4a) and (4b), when the following conditions are satisfied $$\deg G_n(z)F_{jn}(z) > (N-1)\deg H_1(z), \ldots, (N-1)\deg H_N(z) \quad (11a)$$

$$GCD\{G_1(z)F_{j1}(z), \ldots, G_N(z)F_{jN}(z)\}=1 \quad (11b)$$

where: n=1, . . . N and j=1, . . . , J it is guaranteed, as in the case of the inputting of the same signal, that the transfer characteristics of N transmission paths of the N-input single-output linear FIR system are uniquely determined, even if highly correlated signals generated from a plurality of signal sources are input thereinto (see the Appendix to this specification).

By comparing Eq. (7) and the input and output signals in the combination of the highly correlated generating system of the FIG. 3 model and the unknown N-input M-output linear FIR system of FIG. 1, it will be seem that the the outputs of subterms V, F, G and H on the left-hand side of Eq. (7) correspond to the respective signals. That is, the term V of the input signal vector represents the J input signals $V_1(z), \ldots, V_J(z)$ from model sound sources; the product VF of the term V and the transfer characteristic matrix F represents the highly correlated signals $X_1(z), \ldots, X_N(z)$ picked up and combined by the respective microphones in the highly correlated signal generating system; the product VFG of the product VF and the transfer characteristic matrix G of the pre-filters represents the outputs from the pre-filters $\mathbf{12}_1, \ldots, \mathbf{12}_N$, that is, the preprocessed signals $U_1(z), \ldots, U_N(z)$ that are applied to the unknown system; and the product VFGH of the product VFG and the transfer characteristic matrix H of the multiple transmission paths, that is, the right-hand side of Eq. (7) represent the response output Y(z) of the unknown system detected by the microphones $\mathbf{11A}_m$.

Based on the above, $D_1(z), \ldots, D_J(z)$ defined by Eq. (9) are uniquely derived from the J input signals $V_1(z), \ldots, V_J(z)$ from the model sound sources and the microphone output signal Y(z). Furthermore, only one set of $G_1(z)H_1(z), \ldots, G_N(z)H_N(z)$ is determined from the N highly correlated input signals and the microphone output signal Y(z). Accordingly, it is evident that only one set of $H_1(z), \ldots, H_N(z)$ is determined from the input/output relationship between the N input signals having passed through the pre-filters and the microphone output signal Y(z). The actual estimation of $H_1(z), \ldots, H_N(z)$ can be done by a method using an N-input single-output adaptive filter described later on or by some other methods.

While in the above the model sound sources described in FIG. 3 have been used to estimate the transfer characteristics in the FIG. 1 system, the model sound source of FIG. 2 may also be employed.

EMBODIMENT 1

Figure 5:
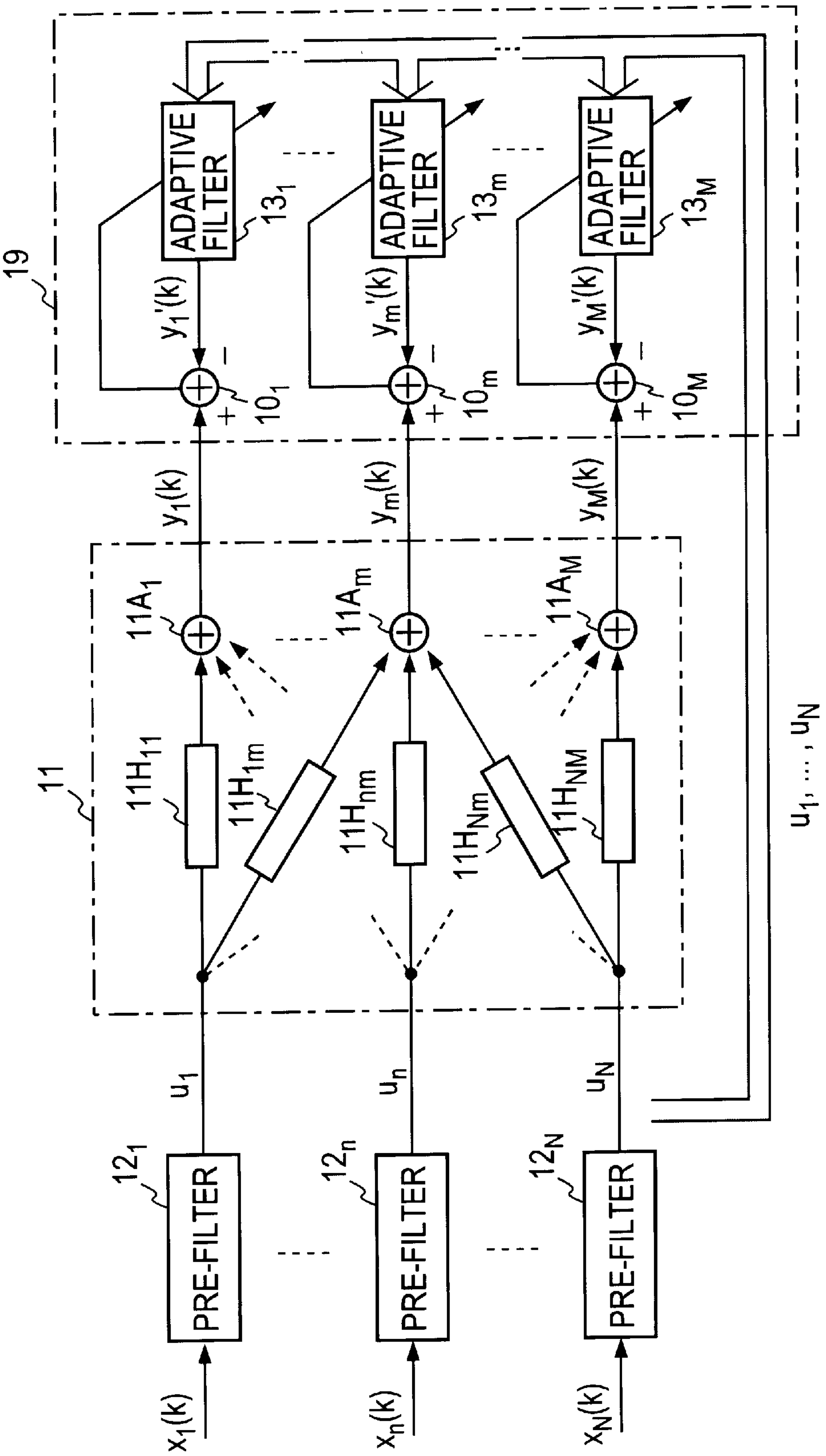
FIG. 5 is a block diagram illustrating a first embodiment of the transfer characteristic measuring apparatus according to the present invention.

FIG. 5 illustrates in block form an apparatus for simultaneously estimating transfer characteristics of N×M transmission paths of an N-input M-output linear system in accordance with a first embodiment of the present invention. This embodiment is intended to estimate the transfer characteristics of an unknown linear system 11 by simulating it with adaptive filters. N input signals $x_1(k), \ldots, x_N(k)$ are processed by the pre-filters $\mathbf{12}_1$, $\mathbf{12}_N$ of different zeros provided according to the present invention, and the preprocessed signals are fed into the N-input M-output linear system 11 of unknown transfer characteristics to be measured. A transfer characteristic estimation part 19 is made up of M N-input single-output adaptive filters $\mathbf{13}_1, \ldots, \mathbf{13}_M$ and M subtractors $\mathbf{10}_1, \ldots, \mathbf{10}_M$. The preprocessed signals $u_1(k), \ldots, u_N(k)$ from the N pre-filters $\mathbf{12}_1, \ldots, \mathbf{12}_N$ are provided as input signals to the M N-input single-output adaptive filters $\mathbf{13}_1, \ldots, \mathbf{13}_M$, from which M signals $y_1'(k), \ldots, y_M'(k)$ are provided as estimation signals (which will hereinafter be referred to as replica signals that simulate signals $y_1(k), \ldots, y_M(k)$). The M subtractors $\mathbf{10}_m$(where m=1, . . . , M) each subtracts the corresponding replica signal $y_m'$ from the response output $y_m(k)$ corresponding thereto, and applies the subtraction result $e_m(k)$ as an error signal to the corresponding adaptive filter $\mathbf{13}_m$. By the M N-input single-output adaptive filters $\mathbf{13}_1, \ldots, \mathbf{13}_M$, the transfer characteristics of the N×M transmission paths $\mathbf{11H}_{nm}(z)$ ($1 \leqq n \leqq N$; $1 \leqq m \leqq M$) of the system 11 are simultaneously estimated separately of each other. In the following description, the suffixes 1 to N and 1 to M will not be used unless required.

Figure 6:
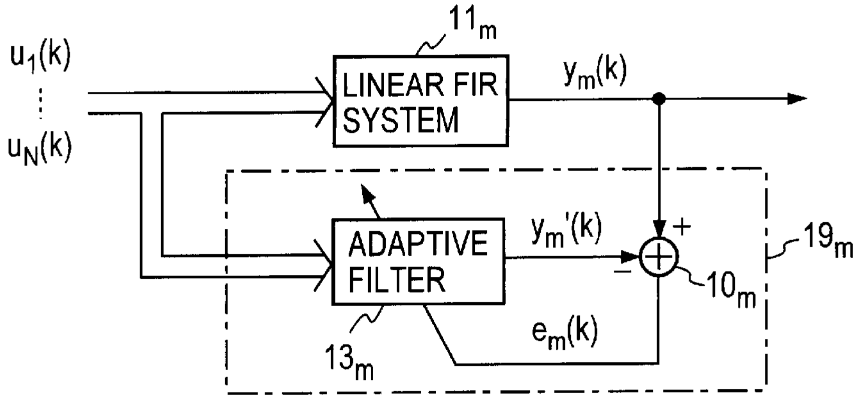
FIG. 6 is a block diagram for explaining the operation of an adaptive filter in connection with an N-input single-output linear system 11*m* in FIG. 5.

Next, the adaptive filters $\mathbf{13}_1, \ldots, \mathbf{13}_M$ will be described. The adaptive filter itself is known, but it will be described, with reference to FIG. 6, as being applied to the estimation of the N-input single-output linear FIR system. In FIG. 6 there are shown one N-input single-output system $\mathbf{11}_m$ in the N-input M-output linear system 11 depicted in FIG. 5 and an adder $\mathbf{10}_m$ and an adaptive filter $\mathbf{13}_m$ that constitute the associated transfer characteristic estimation part denoted by $\mathbf{19}_m$. This embodiment will be described by using discrete signals. Assuming that when the transfer characteristic of the transmission path from the point of inputting thereinto the preprocessed signal u(k) and the point of outputting therefrom the response signal y(k) is linear, there exists a relationship Y(z)=H(z)U(z) in terms of the z-transformation, the adaptive filter $\mathbf{13}_m$ estimates the linear transmission characteristic H(z) from both of the input and output signals u(k) and y(k).

Now, let time be represented by k and assume that the linear FIR system $\mathbf{11}_m$ is supplied with N preprocessed signals $u_n(k)$ (where k=1,2, . . . , and n=1, . . . , N) and outputs a response signals $y_m(k)$. The impulse responses of N linear FIR systems forming the linear system $\mathbf{11}_m$, that is, transmission path $\mathbf{11H}_{1m}, \ldots, \mathbf{11H}_{Nm}$ having transfer characteristics $H_{1m}(z), \ldots, H_{Nm}(z)$, are $h_{nm}(k)$ (where n=1, . . . , N). The relation between the input signal $u_n(k)$ and the response output y(k) is expressed by the following equation using the z-transformation.

$$Y_m(z) = \sum_{n=1}^{N} H_{nm}(z)U_n(z) \quad (12)$$

Letting the tap length of the impulse response be represented by L and the preprocessed signal and the impulse response be expressed in terms of vector as follows:

$$h_{nm}^T=[h_{nm}(L-1), \ldots, h_{nm}(0)] \quad (13)$$

$$u_n^T(k)=[u_n(k-L+1), \ldots, u_n(k)] \ (n=1, \ldots, N) \quad (14)$$

the input/output relation is described by the following convolution $$y_m(k) = \sum_{n=1}^{N}\sum_{i=0}^{L-1} h_{nm}(i)u_n(k-i) = \sum_{n=1}^{N} u_n^T h_{nm} \tag{15}$$

In view of N L-dimensional vectors, that is, the following N vectors that form one N-input single-output adaptive filter $\mathbf{13}_m$ $$w_{nm}^T(k)=[w_{nm}(L-1), \ldots, w_{nm}(0)] \ (n=1, \ldots, N) \tag{16}$$

an error signal e(k) is defined by the following equation as the difference between a replica signal $y_m'$ and the system response output $y_m(k)$ at the time t=k.

$$e_m(k) = y_m(k) - \sum_{n=1}^{N}\sum_{i=0}^{L-1} w_{nm}(i)u_n(k-i) \tag{17}$$

The error signal e(k) and the preprocessed signal u(k) are used to update the coefficient of the adaptive filter at each time k. Several methods have been proposed to update the filter coefficient, one of which is such as expressed by the following equation:

$$w_{nm}^T(k+1)=w_{nm}^T(k)+\alpha e(k)u_n^T(k) \ (n=1, \ldots, N) \tag{18}$$

where $\alpha$ is an adjustment parameter. Incidentally, the present invention is not limited specifically to the above updating method but may also employ other methods.

It is known in the art that when the signal $x_n(k)$ is sufficiently wide-band, the vector $w_{nm}^T(k)$ composed of adaptive filter coefficients converges to a vector $h_{nm}^T$ composed of impulse responses of the linear FIR system after a sufficient time elapsed, that is, $$k\to\infty, |h_{nm}^T - w_{nm}^T(k)| \to [0, \ldots, 0] \ (n=1, \ldots, N) \tag{19}$$

The vector $w_{nm}^T(k)$ composed of adaptive filter coefficients can be used as an estimate of the vector $h_{nm}^T$ composed of impulse responses of the linear FIR system. That is, the transfer characteristic of the adaptive filter that has the coefficient vector $w_{nm}^T(k)$ thus obtained is equal to the transfer characteristic $H_{nm}(z)$ of the N-input single-output linear system under measurement.

Figure 7:
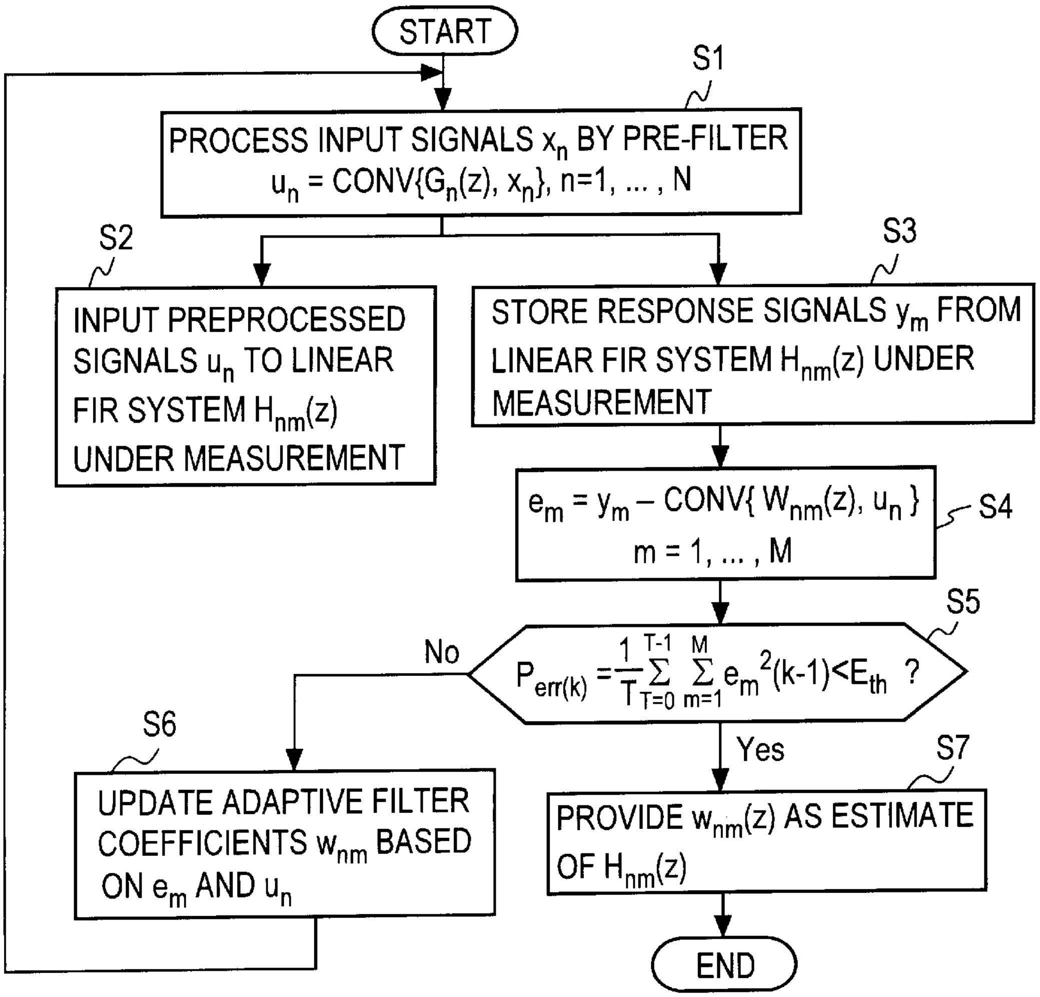
FIG. 7 is a flowchart showing the procedure for measuring transfer characteristics according to the first embodiment.

FIG. 7 is a flowchart for explaining the operation of the FIG. 5 embodiment. In the following description, CONV[A, B] represents a convolution of an FIR filter A and a signal B.

The input signal $x_n(k)$ (where n=1, . . . , N) is applied to the corresponding pre-filter $\mathbf{12}_n$, which performs a convolution $u_n(k)$=CONV[$G_n(z)$,$x_n(k)$] of the input signal $x_n(k)$ and a pre-filter $G_n(z)$ over a predetermined number of samples (step S1). The convolution result is provided to the N-input M-output linear system $\mathbf{11}_m$ (step S2), and at the same time, it is also fed into each N-input single-output adaptive filter $\mathbf{13}_m$ (where m=1, . . . , M) (step S3).

In the transfer characteristic estimation part 19, the N-input single-output filter $\mathbf{13}_m$ carries out a convolution $y_m'(k)$=CONV[$w_{nm}(z)$,$u_n(k)$] of the preprocessed signal $u_n(k)$ and the adaptive filter coefficient $w_{nm}(z)$ to obtain the replica signal $y_m'(k)$. The adder $\mathbf{10}_m$ calculates the error $e_m$ between the system response signal $y_m(k)$ and the replica signal $y_m'(k)$ by the following equation (step S4).

-continued $$e_m(k) = y_m(k) - y_m'(k) = y_m(k) - \sum_{n=1}^{N} CONV[w_{nm}(z), u_n(k)] (m = 1, \ldots, M) \tag{20}$$

Then, it is checked by the following equation whether $P_{err}$, the mean square of the error signal $e_m$ over a fixed time T, is larger than a determined threshold value $E_{th}$ (step S5).

$$P_{err}(k) = \frac{1}{T}\sum_{t=0}^{T-1}\sum_{m=1}^{N} e_m^2(k-t) < E_{th} \tag{21}$$

If the mean square error $P_{err}$ is larger than the threshold value $E_{th}$, then it is judged that the estimation of the transfer characteristic $H_{nm}(z)$ by the coefficient $w_{nm}^T(z)$ of the adaptive filter $\mathbf{13}_m$ has not sufficiently converged, and the adaptive filter $\mathbf{13}_m$ updates its coefficient $w_{nm}^T(z)$ by Eq. (18) based on the system input signal $u_n$ and the error signal $e_m$ (step S6), followed by a return to step S1 to repeat the estimation processing.

If it is found in step S5 that the mean square error $P_{err}$ is smaller than the threshold value $E_{th}$, it is judged that the adaptive filter coefficient $w_{nm}^T(z)$ has sufficiently converged to the transfer characteristic $H_{nm}(z)$, and $w_{nm}^T(z)$ is provided as an estimate of $H_{nm}(z)$ (step S7).

Incidentally, steps S1 through S6 are performed in the same processing cycle, and they are repeated upon each increment of k. By the above processing, the filter coefficient given in step S7 in the flowchart of FIG. 7 is obtained as the results of processing by the adaptive filter.

APPLICATION EXAMPLE 1

Figure 8:
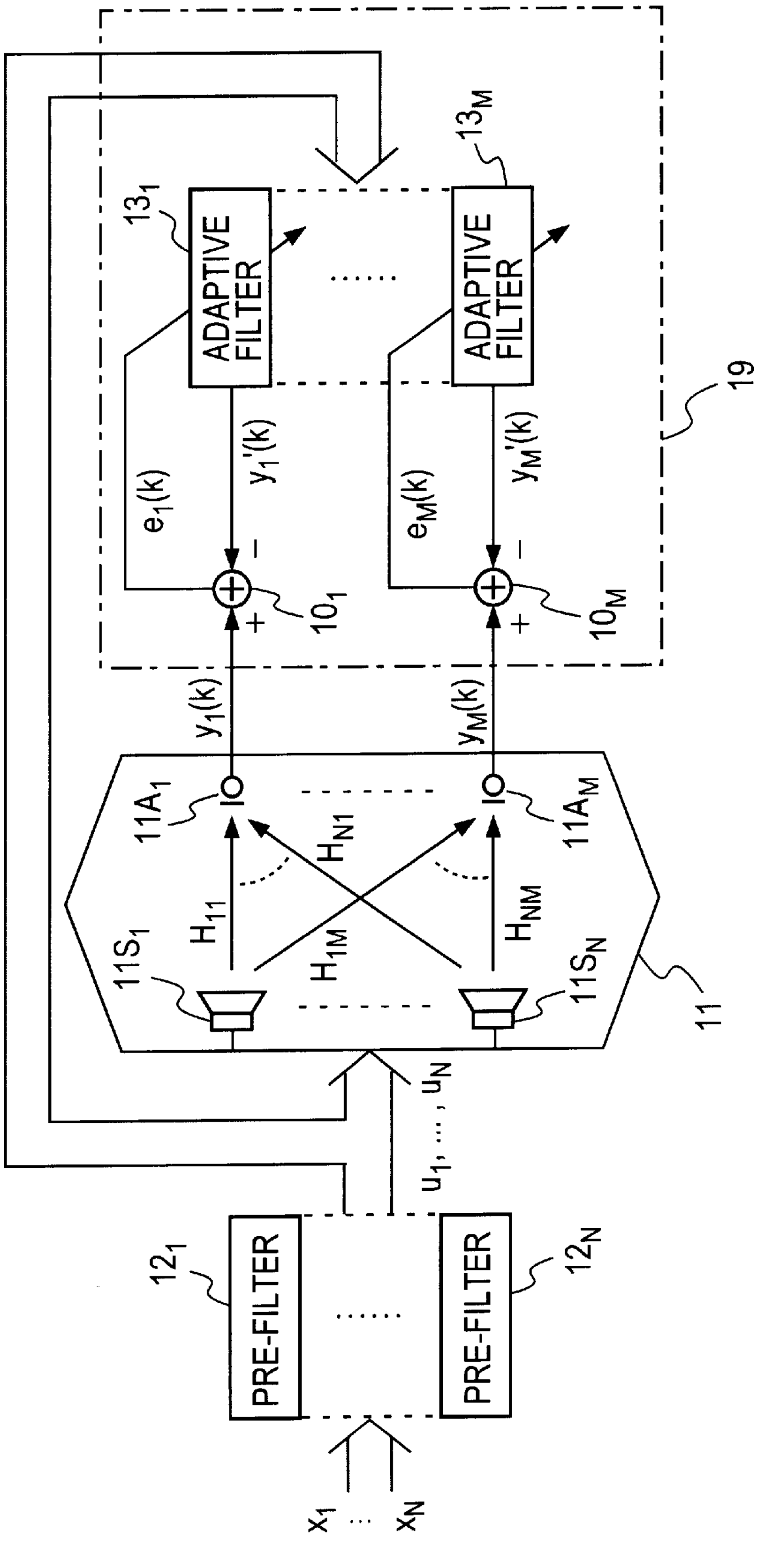
FIG. 8 is a block diagram illustrating the transfer characteristic measuring apparatus of the FIG. 5 embodiment when it is applied to the measurement of transfer characteristics of an acoustic system.

In FIG. 8 there is depicted, as an example of application of the present invention, a method for simultaneous separate estimation of transfer characteristics of N×M transmission paths $H_{nm}(z)$ (where $1\leqq n\leqq M$, $1\leqq m\leqq M$) of the N-input M-output acoustic system 11. The N input signals $x_1(k)$, . . . , $x_N(k)$ are processed by the N pre-filters $\mathbf{12}_1$, . . . , $\mathbf{12}_N$ of different zeros, thereafter being radiated from the N loudspeakers $\mathbf{11S}_1$ to $\mathbf{11S}_N$ into the spatial sound field 11. The N preprocessed signals $u_1(k)$, . . . , $u_N(k)$ provided from the N pre-filters $\mathbf{12}_1$, . . . , $\mathbf{12}_N$ are provided as input signals to the M N-input single-output adaptive filters $\mathbf{13}_1$, . . . , $\mathbf{13}_M$ respectively, then errors $e_m(k)$ between the replica signals $y'_m(k)$ from the adaptive filters and the response signals $y_1(k)$, . . . , $y_M(k)$ from the microphones $\mathbf{11A}_1$, . . . , $\mathbf{11A}_M$ are calculated by the subtractors $\mathbf{10}_m$, and the adaptive filter coefficients are updated so that the mean square error $P_{err}$ may be minimized. By the M N-input single-output adaptive filters, the transfer characteristics of the N×M transmission paths are separately estimated at the same time.

In the case of measuring acoustic transfer characteristics of a concert hall with audience by such an acoustic system measuring scheme as described above, it is possible to simultaneously estimate acoustic transfer characteristics between a plurality of instrument playing positions and a plurality of listening positions. With this scheme, since sufficiently wide-band, highly correlated signals can be used as the drive signals $x_1(k)$, . . . , $x_N(k)$ for estimation, it is possible to measure the acoustic characteristics of the concert hall packed with audience, without using N objectionable, uncorrelated pseudo-noise signals dedicated to measurement.

In an application of the present invention to a home theater with a multi-loudspeaker system, it is possible, by placing a microphone close to the listener's ear, to simultaneously measure acoustic transfer characteristics of transmission paths between the plurality of loudspeakers and the microphone from highly correlated actual speech. The acoustic transfer characteristics between the loudspeakers and the microphone are affected by the reverberation characteristic of the listening room or the posture of the listener, but they can be measured without using such objectionable measurement-dedicated signals as the afore-mentioned pseudo-noise signals.

For the implementation of the above method for the estimation of the transfer characteristics of multiple linear transmission paths, for example, the procedure shown in FIG. 7 may be recorded as a computer program on such as a recording medium as IC-ROM, or magnetic disk, or CD-ROM, or MO disk so that the program is executed as required.

SECOND EMBODIMENT

Figure 9:
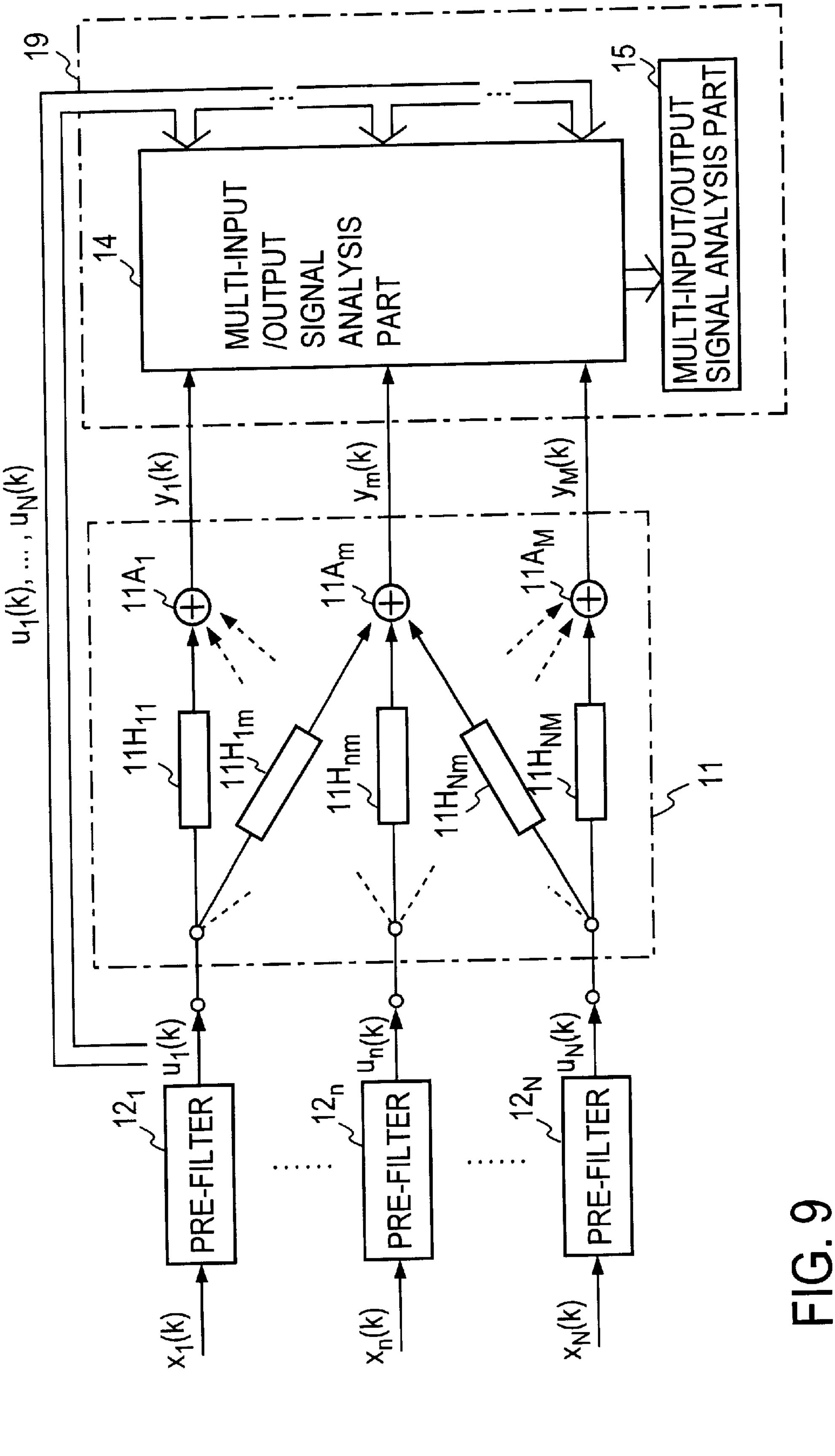
FIG. 9 is a block diagram illustrating a second embodiment of the transfer characteristic measuring apparatus according to the present invention.

FIG. 9 illustrates in block form a second embodiment of the present invention which does not use such adaptive filters $\mathbf{13}_1, \ldots, \mathbf{13}_M$ as used in the embodiments of FIGS. 5 and 8. In this embodiment, output data provided from the unknown N-input M-output linear FIR system in response to the application thereto of the input signals is obtained at a predetermined number of points in time (sample points), then a linear matrix equation that defines the transfer characteristics is generated from such input/output signal data and solved to obtain the transfer characteristics. As is the case with the first embodiment, the pre-filters $\mathbf{12}_1, \ldots, \mathbf{12}_N$ are used to process the input signals $x_1(k), \ldots, x_N(k)$, and the preprocessed signals $u_1(k), \ldots, u_N(k)$ are provided to the N-input M-output linear FIR system 11. The transfer characteristic estimation part 19 is made up of a multi-input/output signal waveform storage part 14 and a multi-input/output signal analysis part 15. The M response outputs $y_1(k), \ldots, y_m(k)$ from the system 11 are held in the multi-input/output signal waveform storage part 14 over a predetermined number k of points in time. Based on the thus stored data, the multi-input/output signal analysis part 15 generates simultaneous linear equations for calculating the transfer characteristics, and solves them to obtain the transfer characteristic of the system 11.

In FIG. 9, the N-input M-output linear FIR system 11 under measurement can be divided into M independent N-input single-output linear FIR systems. The transfer characteristics of the N-input single-output linear system with N input and an m-th output is described by N impulse responses $h_{1m}, \ldots, h_{Nm}$.

Let the tap length of the impulse response in an n-th channel be represented by L. A KL×L matrix $B_n$ (where K is a positive integer equal to or greater than N), which has, as elements, preprocessed signals $u_n(k), \ldots, u_n(k+L-1)$ at contiguous L time points starting at each of k=1, . . . , KL is defined by the following equation.

$$B_n \equiv \begin{bmatrix} u_n(1) & \ldots & u_n(L) \\ \vdots & & \vdots \\ \vdots & & \vdots \\ u_n(KL) & \ldots & u_n(KL+L-1) \end{bmatrix} \tag{22}$$

The relation between each input/output signal and the transfer characteristics is given by the following a linear matrix equation corresponding to simultaneous linear equations for KL variables which constitute each component of the impulse response $h_{nm}$.

$$[B_1, \ldots, B_N]\begin{bmatrix} h_{1m} \\ \vdots \\ h_{Nm} \end{bmatrix} = \begin{bmatrix} y_m(1) \\ \vdots \\ y_m(KL) \end{bmatrix} \tag{23}$$

where the vectors $h_{1m}, \ldots, h_{Nm}$ are those defined by Eq. (13). In Eq. (23), $B_1, \ldots, B_N$ are derived by Eq. (22) from the preprocessed signals $u_n(k)$ (where k=1, . . . ). On the other hand, since $y_m(1), \ldots, y_m(KL)$ are measured as response signals of the system 11, the impulse responses $h_{1m}, \ldots, h_{Nm}$ are obtained by solving the linear matrix equation (23). By z-transforming each impulse response, the acoustic transfer characteristic $H_{nm}(z)$ (where n=1, . . . , N) can be obtained.

The transfer characteristics $H_{1m}(z), \ldots, H_{Nm}(z)$ may also be derived from the impulse responses $h_{1m}, \ldots, h_{Nm}$ from which the influence of noise is suppressed by correlating the preprocessed signals $u_n(k)$ through further modification of Eq. (23) into the following form.

$$\begin{bmatrix} B_1^TB_1 & B_1^TB_2 & \ldots & B_1^TB_N \\ B_2^TB_1 & B_2^TB_2 & \ldots & B_2^TB_N \\ \vdots & \vdots & \ddots & \vdots \\ B_N^TB_1 & \cdots & \cdots & B_N^TB_N \end{bmatrix}\begin{bmatrix} h_{1m} \\ \vdots \\ \vdots \\ h_{Nm} \end{bmatrix} = \begin{bmatrix} B_1^T \\ \vdots \\ \vdots \\ B_N^T \end{bmatrix}\begin{bmatrix} y_m(1) \\ \vdots \\ \vdots \\ y_m(KL) \end{bmatrix} \tag{24}$$

By applying the above processing to each of M N-input single-output linear systems, the N×M signal transmission paths can be estimated. When the input signals are sufficiently wide-band, it is guaranteed that the solution to Eq. (24) is uniquely obtained, since the preprocessed signals generated by the pre-filters $\mathbf{12}_1, \ldots, \mathbf{12}_N$ are applied to the system under measurement.

Figure 10:
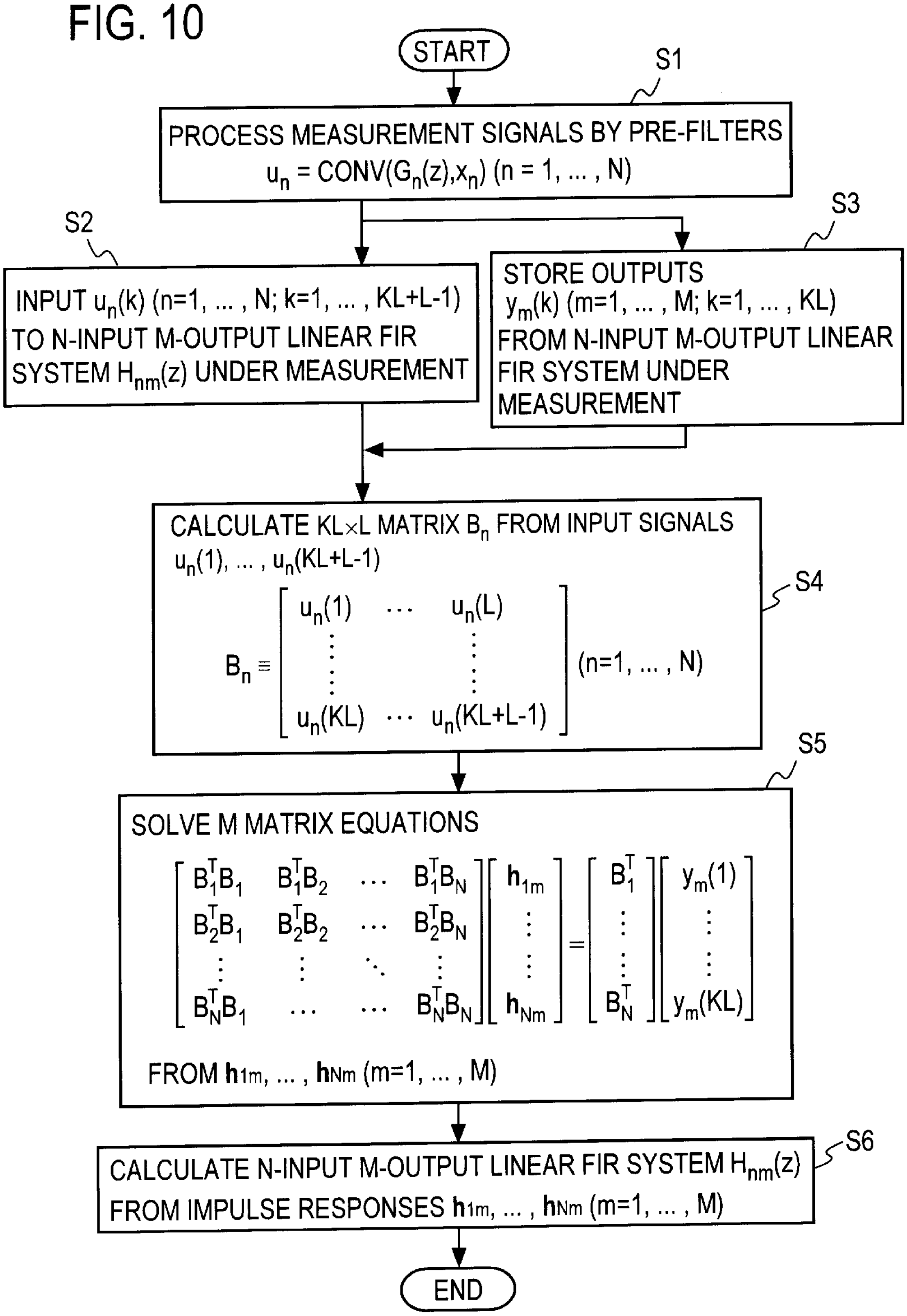
FIG. 10 is a flowchart showing the procedure for measuring transfer characteristics according to the second embodiment.

FIG. 10 is a flowchart showing the procedure for estimating the transfer characteristics according to the second embodiment of FIG. 9.

Step 1: As is the case with the first embodiment, the processing of each input signal $x_n(k)$ by the pre-filter is performed by a convolution, $u_n=\mathrm{CONV}[G_n(z), x_n(k)]$, of the filter $G_n(z)$ and the signal $x_n(k)$ (where n=1, . . . , N).

Step S2: The preprocessed signals $u_n(k)$ thus obtained (where n=1, . . . , N and k=1, . . . , KL) are fed into the N-input M-output linear system 11, and at the same time they are also provided to the multi-input/output signal waveform storage part 14.

Step S3: The response signals $y_m(k)$ (where m=1, . . . , M and k=1, . . . , KL) of the linear system 11 are provided to the multi-input/output signal waveform storage part 14.

Step S4: The KL×L matrix $B_n$ of Eq. (22) is calculated by the multi-input/output signal analysis part 15 from the input signals $u_n(1), \ldots, u_n(KL+L-1)$.

Step S5: Based on the thus calculated matrix $B_n$, the linear matrix equation expressed by Eq. (23) are solved to obtain the impulse responses $h_{1m}, \ldots, h_{Nm}$ (where m=1, . . . , M).

It is evident that this second embodiment is applicable to the measurement of transfer characteristics of multiple transmission lines in an acoustic system similar to that described previously with respect of FIG. 8. No description will be given of such an application of this embodiment.

The measurement procedure according to the present invention described above may also be prerecorded as a computer program on a recording medium so that it is read out therefrom for execution by a computer to measure transfer characteristics of multiple linear transmission paths.

The principle of measuring the transfer characteristics of multi-input/output linear system according to the present invention is applicable not only to the acoustic systems exemplified in the above but also to any systems that can be modeled as the N-input M-output linear FIR system 11. In this instance, the N-input M-output linear FIR system comprises three constituents, i.e. a medium whose transfer characteristics are to be measured, actuators for inputting signals to the medium at a plurality of points, and sensors for detecting response signals at a plurality of output points different from the input points.

For a flexible space structure such an antenna or a solar cell panel of an artificial satellite, or a large marine structure, it is possible to measure its transfer characteristics distributed throughout the structure by detecting its response at plurality of points to excitation signals applied thereto at a plurality of points and to estimate from the measured transfer characteristics how vibration would be distributed throughout the structure if it were shocked.

Figure 11:
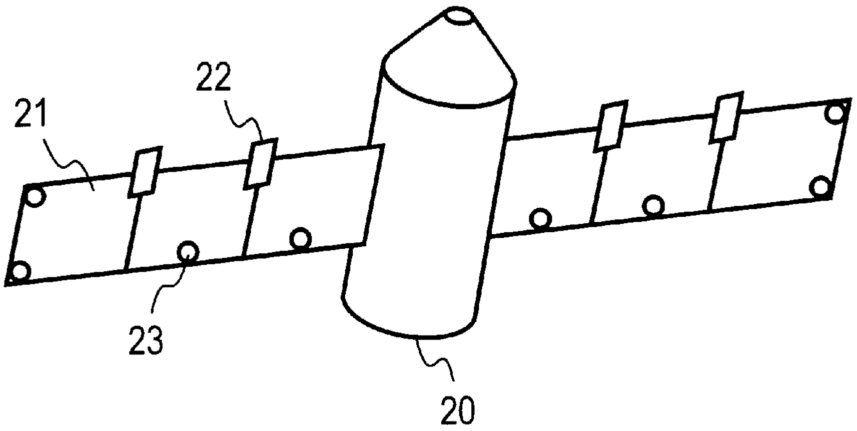
FIG. 11 is a diagram schematically depicting a solar cell panel as a concrete example which embodies the measuring method according to the present invention.

More specifically, in the case of a satellite 20 depicted in FIG. 11, the abovesaid medium corresponds to a solar cell panel 21, the actuators to control motors 22, and the sensors to vibration sensors 23.

Figure 12:
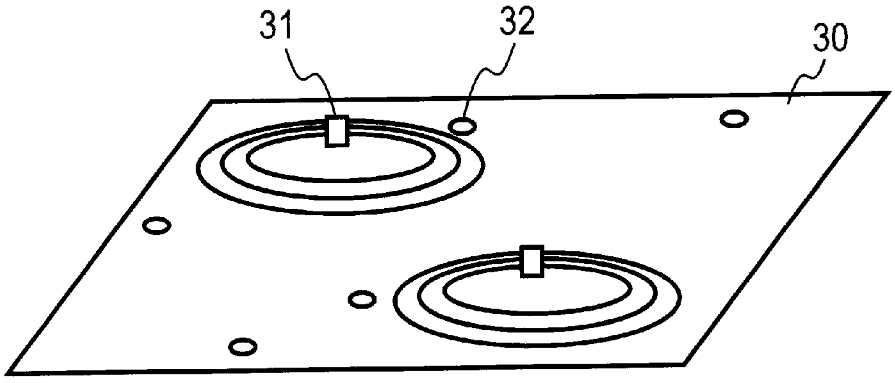
FIG. 12 is a diagram schematically depicting a plate-like member as another concrete example which embodies the measuring method according to the present invention.

In FIG. 12, the medium corresponds to a plate-like flat member 30 through which vibration propagates, the actuators to vibration sources 31, and the sensors to vibration sensors 32.

A member which is provided with N vibration sources 31 and M vibration sensors 32 and transmits therethrough vibration is also regarded as the abovementioned N-input M-output linear system.

A description will be given of the results of two numerical simulations performed to verify the effects of the present invention. A two-input single-output system was used as the linear system 11 of the FIG. 8 embodiment, and two correlated signals were generated by each of the sound source models of FIGS. 2 and 3.

The input signals were measured by 8-kHz sampling, and 512-tapped acoustic transfer characteristics of a room were used. The reverberation time of the room was 200 ms. The coefficients of the adaptive filters $\mathbf{13}_1$ and $\mathbf{13}_2$ were estimated using the ES algorithm (Exponentially weighted Step-size algorithm: S.Makino & Y.Kaneda, "Weighted Step-size Projection Algorithm for Acoustic Echo Cancellers," IEICE Trans., Vol. E75-A, No. 11, pp.1500–1508, November 1992).

As the pre-filters 121 and 122, a maximum-phase filter and a minimum-phase filter with a delay were used. Their transfer functions are given by the following equations.

$$G_1(z^{-1})=0.2+1.0z^{-L}$$

$$G_2(z^{-1})=1.0z^{-L}+0.2z^{-2L} \tag{25}$$

where: L=512

This pair of pre-filters has such properties as follows:

The zero points (except the point at infinity) of the both pre-filters are symmetrical with respect to a unit circle on the z-plane, and are relatively prime.

The frequency-amplitude characteristics of both pre-filters are the same.

The above conditions are common to the two numerical simulations.

(1) Numerical Simulation A

The transfer characteristic estimation by the present invention was verified using the abovementioned two pre-filters, into which the following three kinds of signals were input:

A1: Uncorrelated white noise signals.

A2: Identical white noise signals.

A3: A correlated noise signal generated by a single white noise signal and a FIR filter with 512 taps.

Figure 13A:
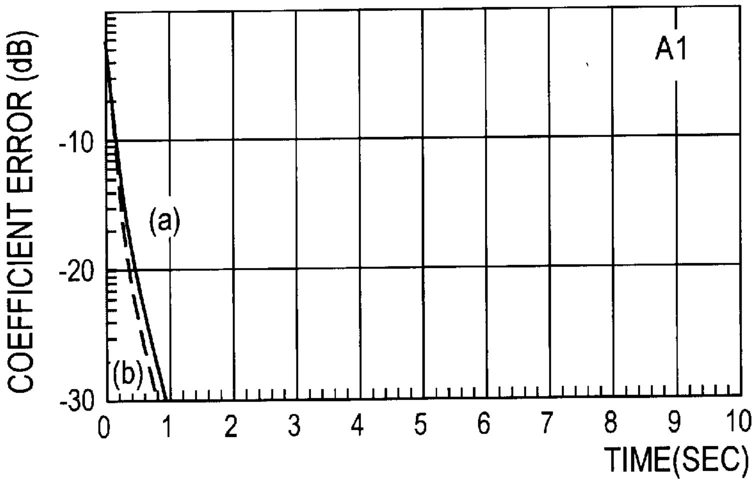
FIG. 13A is a graph showing the results of a numerical simulation of a coefficient error of adaptive filters in the estimation of the transfer characteristic of a two-input single-output system when the two input signals thereto were uncorrelated white noise signals.
Figure 13B:
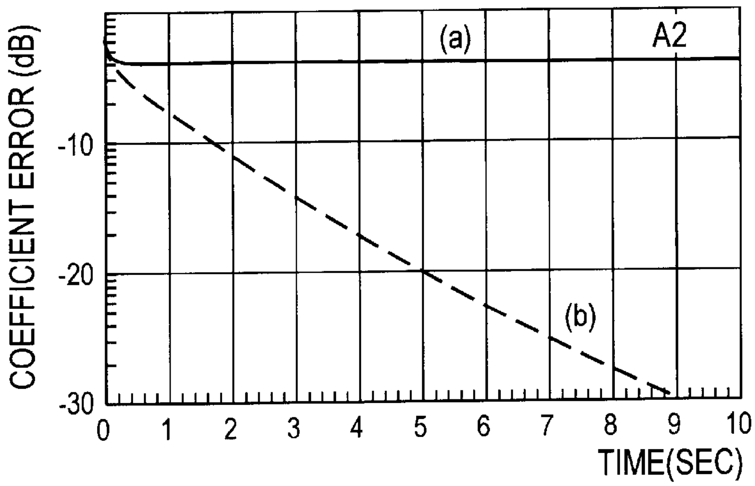
FIG. 13B is a graph showing the results of a numerical simulation of a coefficient error of adaptive filters when the two input signals were identical white noise signals.
Figure 13C:
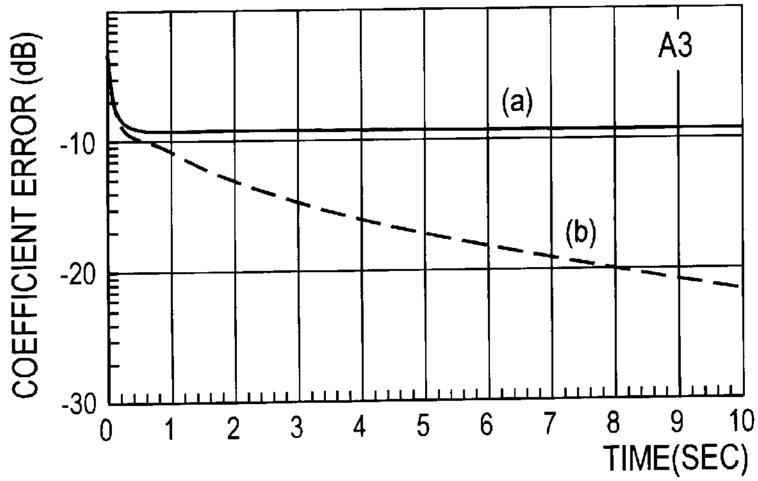
FIG. 13C is a graph showing the results of a numerical simulation of a coefficient error of adaptive filters when the two input signals were correlated noise signals generated by FIR filters from two single white noise signals.

FIG. 13A, 13B and 13C show the results of measurements with the above three kinds of signals. The curve (a) indicates an error $|e|^2$ provided when no pre-filters were used, which is defined by the following equation.

$$|e|^2 = \frac{|h_1 - \hat{h}_1|^2 + |h_2 - \hat{h}_2|^2}{|h_1|^2 + |h_2|^2} \tag{26}$$

The curve (b) indicates an error provided when the pre-filters were used. In the above, $h_1$, $h_2$: true acoustic transfer characteristics expressed by the 512-tapped FIR filter.

$\hat{h}_1$, $\hat{h}_2$: acoustic transfer characteristics estimated by the adaptive filters.

When uncorrelated white noise signals (A1) were input (FIG. 13A), the estimation error decreased to −30 dB in one second irrespective of the use of the pre-filters. When the identical white noise signals (A2) were used (FIG. 13B), the estimation error was sharply reduced by the pre-filters as compared with the case of using no pre-filters (a). In the case of the curve (a) the estimation error was saturated in the vicinity of −4 dB, whereas in the curve (b) the estimation error kept on reducing after reaching −20 dB in five seconds. This tendency was also observed when the correlated noise signals (A3) were input (FIG. 13C). The curve (a) was saturated at about −9 dB, whereas the curve (b) reached −20 dB in eight seconds. These measured results confined the effectiveness of the multiple acoustic transmission path estimating method using mutually prime pre-filters.

(2) Numerical Simulation B

Figure 14A:
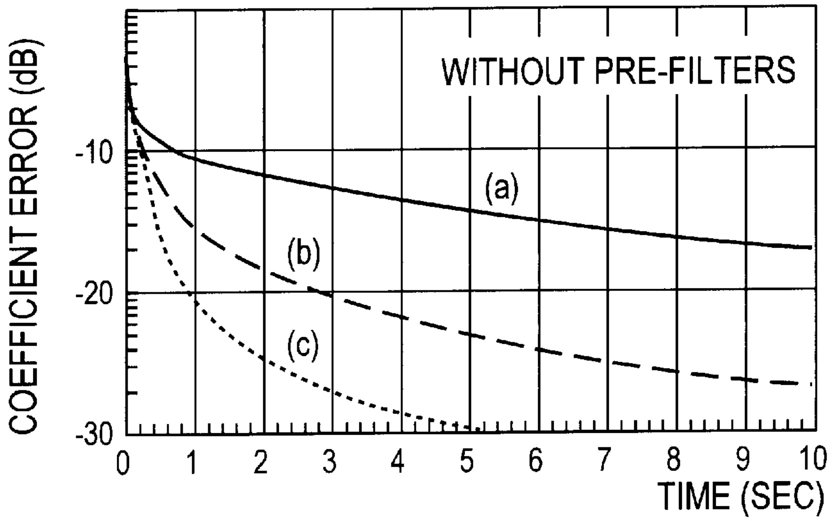
FIG. 14A is a graph showing the results of a numerical simulation of a coefficient error of adaptive filters in the estimation of the transfer characteristic of a two-input single-output system supplied with two correlated input signals generated from two independent sound sources but not passed through pre-filters.
Figure 14B:
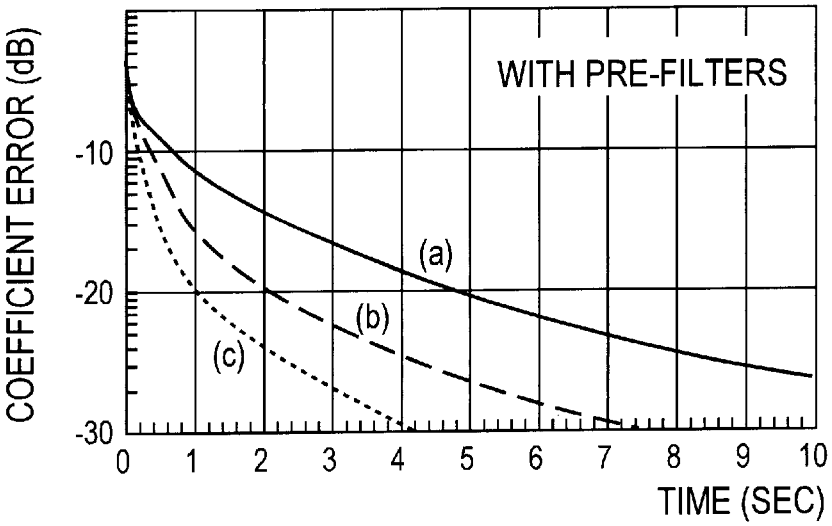
FIG. 14B is a graph showing the results of a numerical simulation of a coefficient error of adaptive filters when the two input signals were passed through the pre-filters.

The multiple acoustic transmission path estimating method according to the present invention was verified using three kinds of two-channel input signals produced by four FIR filters simulating acoustic transfer characteristics of a room with two independent sound sources and 512 taps. In FIGS. 14A and 14B there are shown variations in the estimation error of the adaptive filter defined by Eq. (26) in the cases where no pre-filters were used and where the pre-filters were used. The curves (a), (b) and (c) show the estimation errors measured when the amplitude ratios between the signals from the two sound sources were 1:10, 3:10 and 10:10, respectively.

A comparison of FIGS. 14A and 14B does not clearly indicate the effect of introduction of the pre-filters when the amplitude ratio between the two sound sources is 10:10. However, it is apparent that the introduction of the pre-filters becomes more and more effective with a decrease in the amplitude ratio.

From the viewpoint of the framework of pre-filters, it is also possible to explain why when no pre-filters are used, the estimation error keeps on decreasing without being saturated. Assuming that the two input signals are highly correlated in the simulation B, and letting r represent the amplitude ratio between the two sound sources, the following equation provides a good approximation.

$$X_2(z) \cong \frac{J_2(z, r)}{J_1(z, r)} X_1(z) \tag{27}$$

Using the z-transformation, the relation between the input and output signals is given by $$[H_1(z)J_1(z,r)+H_2(z)J_2(z,r)]X_1(z)=J_1(z,r)Y(z) \tag{28}$$

The tendency that the convergence speed increases as the amplitude ratio approaches zero suggests that $J_1(z,r)$ and $J_2(z,r)$ defined by Eq. (27) each perform the same function as the pre-filter, and that the distance between zero points of $J_1(z,r)$ and $J_2(z,r)$ in the z-plane increases as r approaches 1.

EFFECT OF THE INVENTION

As described above, according to the present invention, even in the case of driving an N-input M-output linear FIR system by identical signals or highly correlated signals, N pre-filters designed with no common zero points are each connected to the stage preceding each input point, and the N×M signal transmission paths of the N-input M-output linear FIR system can simultaneously be estimated by adaptive filters which generates replicas of the M output signals from the output signals of the pre-filters.

It will be apparent that many modifications and variations may be effected without departing from the scope of the novel concepts of the present invention.

APPENDIX

The followings are partial translation of the literature by the present inventors entitled "Precise estimation of multiple transmission paths in a linear system", TECHNICAL REPORT OR IEICE, EA98-62, pp. 25–32, September 1998:

A description will be given of the simultaneous estimation of N acoustic paths between N loudspeakers and one microphone. Assume that the degree of each acoustic path is given by M−1, and that the N input signals are the same signal x(k). Letting the signal to be picked up by the microphone be represented by y(k) and the transfer function of the transmission path from the input point of the signal x(k) to the output point of the signal y(k) by $H_0(z)$. The relation between the acoustic path and the pre-filters is given by $$G_1(z)H_1(z)+G_2(z)H_2(z)+\ldots+G_N(z)H_N(z)=H_0(z). \qquad \text{(A-1)}$$

For simultaneous estimation of the N acoustic paths from the signals having passed through the pre-filters and the microphone signal y(k), it is necessary that $H_n(z)$ be uniquely determined which satisfies Eq. (A-1).

Now, it will be proved below that there exist pre-filters for simultaneously estimating N acoustic paths from identical N input signals x(z) and that their degree is given by (N−1)M. Let the degree of each of the N pre-filters be represented by L−1, and consider an NM×(L+M−1) matrix S(M) that is defined by the following equation.

$$G_n(z) = g_{nL-1}z^{L-1} + g_{nL-2}z^{L-2} + \ldots + g_{n0}z^0 \qquad \text{(A-2)}$$

$$G_n(M) \cong \overbrace{\begin{bmatrix} g_{nL-1} & \cdots & \cdots & g_{n0} & 0 & & 0 \\ 0 & g_{nL-1} & \cdots & & g_{n0} & & \\ & & \ddots & & & \ddots & \\ 0 & & & g_{nL-1} & \cdots & \cdots & g_{n0} \end{bmatrix}}^{L+M-1} \Bigg\} M$$

$$S(M) \cong \begin{bmatrix} G_1(M) \\ \vdots \\ G_N(M) \end{bmatrix}$$

$$H_n(z) = h_{nM-1}z^{M-1} + h_{nM-2}z^{M-2} + \ldots + h_{n0}$$

$$\bar{h}_n^T = [h_{nM-1}, h_{nM-2}, \ldots , h_{n0}]$$

$$H_0(z) = h_{0L+M-1}z^{L+M-1} + h_{0L+M-2}z^{L+M-2} + \ldots h_{00}$$

$$\bar{h}_0^T = [h_{0L+M-1}, h_{0L+M-2}, \ldots , h_{00}]$$

The relationships between the N acoustic paths and the pre-filters are given by the following equation $$[h_1^T, h_2^T, \ldots, h_N^T]S(M)=h_0^T. \qquad \text{(A-3)}$$

If the matrix S(M) is a square matrix and is regular, then $[h_1^T, h_2^T, \ldots, h_N^T]$ will apparently determined uniquely from $h_0^T$. When the following conditions (a) and (b) are satisfied for the square matrix S(M), it has been proved, based on a discussion about a generalized resultant matrix obtainable by a replacement of S(M), that the rank of the matrix S(M) satisfies Eq. (A-4) (S.Kung, T.Kailath and M.Morf, "A Generalized Resultant Matrix for Polynomial Matrices," Proc. IEEE Conference on decision and Control, pp.892–895, December 1976).

(a) The degree of $G_N(z)$ is (L−1)th.

(b) The two matrices $\{G_1(z), \ldots, G_{N-1}(z)]^T$ and $G_N(z)$ are irreducible (i.e. mutually prime).

$$\text{rank } S(M)=M+\deg G_N(z)=M+L-1 \qquad \text{(A-4)}$$

By designing the pre-filters so that the matrix S(M) becomes a square matrix (that is, NM=M+L−1) and that $G_1(z), \ldots, G_n(z)$ satisfy the conditions (a) and (b), the matrix S(M) becomes square based on Eq. (A-4). Hence, the transfer characteristics of the N acoustic paths $H_1(z), \ldots, H_N(z)$ are uniquely estimated. In this case, the following equation holds for the degree L−1 of the pre-filters.

$$L-1=(N-1)M \qquad \text{(A-5)}$$

What is claimed is:

1. A transfer characteristic measuring apparatus for simultaneously measuring transfer characteristics of N×M transmission paths of a linear FIR system defined between its N input points and M output points, said N and M being an integer equal to or greater than 2 and an integer equal to or greater than 1, respectively, said apparatus comprising:

N pre-filters having transfer characteristics of different zeros, for processing N-channel signals input thereinto and for outputting preprocessed signals, respectively;

N actuators for inputting said preprocessed signals from said N pre-filters to said N input points of said linear FIR system, respectively;

M sensors for detecting response signals from said linear FIR system at said M output points; and a transfer characteristic estimation part for calculating the transfer characteristics of said N×M transmission paths from said preprocessed signals output from said N pre-filters and said response signals detected by said M sensors;

wherein said transfer characteristic estimation part includes: M N-input single-output adaptive filters supplied with said preprocessed signals from said N pre-filters, for outputting replica signals that are estimated versions of said response signals from said linear FIR system; and M subtractors supplied with said M replica signals and said M response signals from said linear FIR system, for detecting their differences and generating error signals corresponding thereto and for applying said M error signals to said M adaptive filters corresponding to said M subtractors, respectively, and wherein said M adaptive filters include means for adaptively updating filter coefficients representative of their transfer characteristics so that said error signals are minimized to thereby obtain said updated filter coefficients as impulse responses indicative of the transfer characteristics of said linear FIR system.

2. The apparatus of claim 1, wherein, letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(k), \ldots, y_M(k)$, their z-transformations by $Y_1(z), \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where n=1, . . . , N, m=1, . . . , M;

said pre-filters generate said preprocessed signals $u_n(k)$ by performing the following operation:

$$U_n(z)=X_n(z)G_n(z);$$

said adaptive filters generate said replica signals $y_m'(k)$ by performing the following operation:

$$y'_m(k) = \sum_{n=1}^{N}\sum_{i=0}^{L-1} w_{nm}(i)u_{nm}(k-i);$$

where L is the tap number of taps of said adaptive filters and $w_{nm}(0), \ldots, w_{nm}(L-1)$ are their impulse responses;

said subtractors generates said error signals by performing the following operation:

$$e_m(k)=y_m(k)-y_m'(k);$$

and said adaptive filters update their impulse responses by performing the following operation using said error signals and the outputs from said pre-filters at each time point k;

$$w_{nm}^T(k+1)=w_{nm}^T(k)+\alpha e(k)u_n^T(k),$$

where $u_n^T(k)=[u_n(k-L+1), \ldots, u_n(k)]$, n=1, . . . , N, and where $w_{nm}(k)$ is a vector composed of impulse responses of adaptive filters at time point k, $w_{nm}^T(k)=[w_{nm}(L-1), \ldots, w_{nm}(0)]$ and said $\alpha$ is a predetermined adjustment parameter.

3. The apparatus of claim 2, wherein said adaptive filters each includes means which when the mean-square of said error signal becomes smaller than a predetermined value, terminates said updating and provides the filter coefficient of said each adaptive filter at that time as an impulse response representative of the corresponding transfer characteristic of said linear FIR system.

4. A transfer characteristic measuring apparatus for simultaneously measuring transfer characteristics of N×M transmission paths of a linear FIR system defined between its N input points and M output points, said N and M being an integer equal to or greater than 2 and an integer equal to or greater than 1, respectively, said apparatus comprising:

N pre-filters having transfer characteristics of different zeros, for processing N-channel signals input thereinto and for outputting preprocessed signals, respectively;

N actuators for inputting said preprocessed signals from said N pre-filters to said N input points of said linear FIR system, respectively;

M sensors for detecting response signals from said linear FIR system at said M output points; and a transfer characteristic estimation part for calculating the transfer characteristics of said N×M transmission paths from said preprocessed signals output from said N pre-filters and said response signals detected by said M sensors;

wherein said transfer characteristic estimation part includes: multi-input/output waveform storage means supplied with said M response signals from said linear FIR system and said N preprocessed signals from said N pre-filters, for storing them over a predetermined number of points in time; and multi-input/output signal analysis means for obtaining said transfer characteristics of said linear FIR system by solving simultaneous equations which are obtained by setting that vectors using said stored response signals as elements are equal to the products of a matrix composed of said preprocessed signals and a vector composed of the transfer characteristics of said linear FIR system.

5. The apparatus of claim 4, wherein: letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(k), \ldots, y_M(k)$, their z-transformations by $Y_1(z), \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where n=1, . . . , N, m=1, . . . , M;

said pre-filters generate said preprocessed signals $u_n(k)$ by performing the following operation $$u_n(z)=X_n(z)G_n(z); \text{ and}$$

said multi-input/output signal analysis means includes means for obtaining impulse responses $h_{1m}, \ldots, h_{Nm}$ representative of the transfer characteristics of said linear FIR system by solving the following simultaneous linear equation in matrix form $$[B_1, \ldots, B_N]\begin{bmatrix} h_{1m} \\ \vdots \\ h_{Nm} \end{bmatrix} = \begin{bmatrix} y_m(1) \\ \vdots \\ y_m(KL) \end{bmatrix}$$

through the use of a matrix defined below and response vectors of said transfer characteristics $H_{nm}(z)$, said matrix being defined by the following equation having, as KL×L elements, preprocessed signals $u_n(k), \ldots, u_{n(+L-}1)$ at contiguous L time points starting at each of k=1, . . . , KL is defined by the following equation:

$$B_n \equiv \begin{bmatrix} u_n(1) & \ldots & u_n(L) \\ \vdots & & \vdots \\ \vdots & & \vdots \\ u_n(KL) & \ldots & u_n(KL+L-1) \end{bmatrix}$$

where L is the number of taps of the impulse responses indicative of said transfer characteristics $H_{nm}(z)$, and $h_{nm}^T$ and $u_n^T(k)$ are said impulse vectors of said transfer characteristics $H_{nm}(z)$ and preprocessed signal vectors defined by the following equations, respectively, $$h_{nm}^T=[h_{nm}(L-1), \ldots, h_{nm}(0)]$$

$$u_n^T(k)=[u_n(k-L+1), \ldots, u_n(k)]$$

where: n=1, . . . , N.

6. The apparatus of claim 5, wherein said multi-input/output signal analysis means estimates the transfer characteristics of said linear FIR system by solving simultaneous linear equations defined by the following equation obtained by multiplying both sides of said simultaneous linear equations by a matrix $[B_1^T, \ldots, B_N^T]^T$ to correlate input signal components on its left-hand side $$\begin{bmatrix} B_1^T B_1 & B_1^T B_2 & \dots & B_1^T B_N \\ B_2^T B_1 & B_2^T B_2 & \dots & B_2^T B_N \\ \vdots & \vdots & \ddots & \vdots \\ B_N^T B_1 & \dots & \dots & B_N^T B_N \end{bmatrix} \begin{bmatrix} h_{1m} \\ \vdots \\ \vdots \\ h_{Nm} \end{bmatrix} = \begin{bmatrix} B_1^T \\ \vdots \\ \vdots \\ B_N^T \end{bmatrix} \begin{bmatrix} y_m(1) \\ \vdots \\ \vdots \\ y_m(KL) \end{bmatrix}.$$

7. The apparatus of any one of claims 1 through 6, wherein said linear FIR system is an acoustic hall, said N actuators are N loudspeakers, and said M sensors are M microphones.

8. A transfer characteristic measuring method for simultaneously measuring transfer characteristics of N×M transmission paths of a linear FIR system defined between its N input points and M output points, said N and M being an integer equal to or greater than 2 and an integer equal to or greater than 1, respectively, said method comprising the steps of:

(a) processing N-channel input signals by N pre-filters having transfer functions of different zeros to thereby generate N-channel preprocessed signals;

(b) inputting said N-channel preprocessed signals by N actuators to said N input points of said linear FIR system, respectively;

(c) detecting response signals from said linear FIR system by M sensors at said M output points; and (d) estimating the transfer characteristics of said N×M transmission paths from said N-channel preprocessed signals and said response signals detected by said M sensors at said M output points;

wherein said step (d) includes a step of: inputting said N-channel preprocessed signals to M N-input single-output adaptive filters, respectively; generating replica signals that are estimated versions of said M response signals from said linear FIR system; detecting differences between said M replica signals and said M response signals from said linear FIR system and generating error signals corresponding to said detected differences, respectively; and adaptively updating filter coefficients representative of their transfer characteristics so that said error signals are minimized.

9. The method of claim 8, wherein, letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(k), \ldots, y_M(k)$, their z-transformations by $Y_1(z), \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where $n=1, \ldots, N$, $m=1, \ldots, M$;

said step (a) is a step of generating said preprocessed signals $u_n(k)$ by performing the following operation:

$U_n(z)=X_n(z)G_n(z)$; and said step (d) includes steps of:

generating said replica signals $y_m'(k)$ by performing the following operation:

$$y'_m(k) = \sum_{n=1}^{N} \sum_{i=0}^{L-1} w_{\mathrm{nm}}(i) u_{\mathrm{nm}}(k-i);$$

where L is the number taps of said adaptive filters and $w_{nm}(0), \ldots, w_{nm}(L-1)$ are their impulse responses;

generating said error signals by performing the following operation:

$$e_m(k)=y_m(k)-y_m'(k);$$

and updating impulse responses of said adaptive filters by performing the following operation using said error signals and the outputs from said pre-filters at each time point k, $$w_{nm}^T(k+1)=w_{nm}^T(k)+\alpha e(k)u_n^T(k),$$

where $u_n^T(k)=[u_n(k-L+1), \ldots, u_n(k)]$, $n=1, \ldots, N$, and where $w_{nm}(k)$ is a vector composed of impulse responses of adaptive filters at time point k, $w_{nm}^T(k)=[w_{nm}(L-1), \ldots, w_{nm}(0)]$ and said $\alpha$ is a predetermined adjustment parameter.

10. The method of claim 9, wherein said step (d) includes a step of: calculating the mean square of said error signals at each point in time: terminating said updating when the value of said mean-square error becomes smaller than a predetermined value; and providing impulse responses of said adaptive filters at that time as said impulse responses representative of the transfer characteristics of said linear FIR system.

11. A transfer characteristic measuring method for simultaneously measuring transfer characteristics of N×M transmission paths of a linear FIR system defined between its N input points and M output points, said N and M being an integer equal to or greater than 2 and an integer equal to or greater than 1, respectively, said method comprising the steps of:

(a) processing N-channel input signals by N pre-filters having transfer functions of different zeros to thereby generate N-channel preprocessed signals;

(b) inputting said N-channel preprocessed signals by N actuators to said N input points of said linear FIR system, respectively;

(c) detection response signals from said linear FIR system by M sensors at said M output points; and (d) estimating the transfer characteristics of said N×M transmission paths from said N-channel preprocessed signals and said response signals detected by said M sensors at said M output points;

wherein said step (d) includes a step of: storing said response signals from said linear FIR system and said N-channel preprocessed signals over a predetermined number of points in time; and obtaining said transfer characteristics of said linear FIR system by solving simultaneous linear equations which are obtained by setting that vectors using said stored response signals as elements are equal to the products of a matrix composed of said preprocessed signals and a vector composed of said transfer characteristics of said linear FIR system.

12. The method of claim 11, wherein, letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(k), \ldots, y_M(k)$, their z-transformations by $Y_1(z), \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where $n=1, \ldots, N$, $m=1, \ldots, M$;

said step (a) is a step of generating said preprocessed signals $u_n(k)$ by performing the following operation $U_n(z)=X_n(z)G_N(z)$; and said step (d) includes a step of obtaining impulse responses $h_{1m}, \ldots, h_{Nm}$ representative of the transfer characteristics of said linear FIR system by solving the following simultaneous linear equation in matrix form:

$$[B_1, \ldots, B_N]\begin{bmatrix} h_{1m} \\ \vdots \\ h_{Nm} \end{bmatrix} = \begin{bmatrix} y_m(1) \\ \vdots \\ y_m(KL) \end{bmatrix}$$

through the use of a matrix defined below and response vectors of said transfer characteristics $H_{nm}(z)$, said matrix being defined by the following equation having, as KL×L elements, preprocessed signals $u_n(k), \ldots, u_n(k+L-1)$ at contiguous L time points starting at each of $k=1, \ldots, KL$ is defined by the following equation:

$$B_n \equiv \begin{bmatrix} u_n(1) & \ldots & u_n(L) \\ \vdots & & \vdots \\ \vdots & & \vdots \\ u_n(KL) & \ldots & u_n(KL+L-1) \end{bmatrix}$$

where L is the number of taps of the impulse responses indicative of said transfer characteristics $H_{nm}(z)$, and $h_{nm}^T$ and $u_n^T(k)$ are said impulse vectors of said transfer characteristics $H_{nm}(z)$ and preprocessed signal vectors defined by the following equations, respectively, $h_{nm}^{T}=[h_{nm}(L-1), \ldots, h_{nm}(0)]$ $u_n^T(k)=[u_n(k-L+1), \ldots, u_n(k)]$ where: $n=1, \ldots, N$.

13. The method of claim 12, which estimates the transfer characteristics of said linear FIR system by solving simultaneous linear equations defined by the following equation obtained by multiplying both sides of said simultaneous linear equations by a matrix $[B_1^T, \ldots, B_N^T]^T$ to correlate input signal components on its left-hand side $$\begin{bmatrix} B_1^TB_1 & B_1^TB_2 & \ldots & B_1^TB_N \\ B_2^TB_1 & B_2^TB_2 & \ldots & B_2^TB_N \\ \vdots & \vdots & \ddots & \vdots \\ B_N^TB_1 & \ldots & \ldots & B_N^TB_N \end{bmatrix}\begin{bmatrix} h_{1m} \\ \vdots \\ \vdots \\ h_{Nm} \end{bmatrix} = \begin{bmatrix} B_1^T \\ \vdots \\ \vdots \\ B_N^T \end{bmatrix}\begin{bmatrix} y_m(1) \\ \vdots \\ \vdots \\ y_m(KL) \end{bmatrix}.$$

14. The method of any one of claims 8 through 13, wherein said linear FIR system is an acoustic hall, said N actuators are N loudspeakers, and said M sensors are M microphones.

15. A recording medium on which there are recorded, as a program for execution by a computer, a procedure for simultaneously measuring transfer characteristics of N×M transmission paths of a linear FIR system defined between its N input points and M output points, said N and M being an integer equal to or greater than 2 and an integer equal to or greater than 1, respectively, said program comprising the steps of:

(a) processing N-channel input signals by N pre-filters having transfer characteristics of different zero points to thereby generate N-channel preprocessed signals;

(b) inputting said N-channel preprocessed signals by N actuators to said N input points of said linear FIR system respectively;

(c) detecting response signals from said linear FIR system by M sensors at said M output points; and (d) estimating the transfer characteristics of said N×M transmission paths from said N-channel preprocessed signals and said response signals detected by said M sensors at said M output points;

wherein said step (d) includes a step of: inputting said N-channel preprocessed signals to M N-input single-output adaptive filters, respectively; generating replica signals that are estimated versions of said M response signals from said linear FIR system; detecting differences between said M replica signals and said M response signals from said linear FIR system and generating error signals corresponding to said detected differences, respectively; and adaptively updating filter coefficients representative of their transfer characteristics so that said error signals are minimized.

16. The medium of claim 15, wherein, letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(c), \ldots, y_M(k)$, their z-transformations by $Y_1(z). \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where $n=1, \ldots, N$, $m=1, \ldots, M$;

said step (a) is a step of generating said preprocessed signals $u_n(k)$ by performing the following operation;

$U_n(z)=X_n(z)G_n(z)$; and said step (d) includes steps of:

generating said replica signals $y_m'(k)$ by performing the following operation:

$$y_m'(k) = \sum_{n=1}^{N}\sum_{i=0}^{L-1} w_{nm}(i)u_{nm}(k-i);$$

where L is the number of taps of said adaptive filters and $w_{nm}(0), \ldots, w_{nm}(L-1)$ are their impulse responses;

generating said error signals by performing the following operation $e_m(k)=y_m(k)-y_m'(k)$;

and updating impulse responses of said adaptive filters by performing the following operation using said error signals and the outputs from said pre-filters at each time point k, $w_{nm}^T(k+1)=w_{nm}^T(k)+\alpha e(k)u_n^T(k)$, where $u_n^T(k)=[u_n(k-L+1), \ldots, u_n(k)]$, $n=1, \ldots, N$, and where $w_{nm}(k)$ is a vector composed of impulse responses of adaptive filters at time point k, $w_{nm}^T(k)=[w_{nm}(L-1), \ldots, w_{nm}(0)]$ and said $\alpha$ is a predetermined adjustment parameter.

17. The medium of claim 16, wherein said step (d) includes a step of: calculating the power of said error signals at each point in time: terminating said updating when the value of said power becomes smaller than a predetermined value; and providing impulse responses of said adaptive filters at that time as said impulse responses representative of the transfer characteristics of said linear FIR system.

18. A recording medium on which there are recorded, as a program for execution by a computer, a procedure for simultaneously measuring transfer characteristics of N×M transmission paths of a linear FIR system defined between its N input points and M output points, said N and M being an integer equal to or greater than 2 and an integer equal to or greater than 1, respectively, said program comprising the steps of:

(a) processing N-channel input signals by N pre-filters having transfer characteristics of different zeros to thereby generate N-channel preprocessed signals;

(b) inputting said N-channel preprocessed signals by N actuators to said N input points of said linear FIR system, respectively;

(c) detecting response signals from said linear FIR system by M sensors at said M output points; and (d) estimating the transfer characteristics of said N×M transmission paths from said N-channel preprocessed signals and said response signals detected by said M sensors at said M output points;

wherein said step (d) includes a step of: storing said response signals from said linear FIR system and said N-channel preprocessed signals over a predetermined number of points in time; and obtaining said transfer characteristics of said linear FIR system by solving simultaneous linear equations which are obtained by setting that vectors using said stored response signals as elements are equal to the products of a matrix composed of said preprocessed signals and a vector composed of said transfer characteristics of said linear FIR system.

19. The medium of claim 18, wherein, letting said N-channel input signals be represented by $x_1(k), \ldots, x_N(k)$, their z-transformations by $X_1(z), \ldots, X_N(z)$, said preprocessed signals from said pre-filters by $u_1(k), \ldots, u_N(k)$, their z-transformations by $U_1(k), \ldots, U_N(z)$, the outputs from said M sensors by $y_1(k), \ldots, y_M(k)$, their z-transformations by $Y_1(z), \ldots, Y_M(z)$, the transfer characteristics of said N pre-filters by $G_1(z), \ldots, G_N(z)$, and the transfer characteristics of said N×M transmission paths of said linear FIR system by $H_{nm}(z)$ where $n=1, \ldots, N$, $m=1, \ldots, M$;

said step (a) is a step of generating said preprocessed signals $u_n(k)$ by performing the following operation $$U_n(z)=X_n(z)G_N(z);\text{ and}$$

said step (d) includes a step of obtaining impulse responses $h_{1m}, \ldots, h_{Nm}$ representative of the transfer characteristics of said linear FIR system by solving the following simultaneous linear equation in matrix form;

$$[B_1, \ldots, B_N]\begin{bmatrix} h_{1m} \\ \vdots \\ h_{Nm} \end{bmatrix} = \begin{bmatrix} y_m(1) \\ \vdots \\ y_m(KL) \end{bmatrix}$$

through the use of a matrix defined below and response vectors of said transfer characteristics $H_{nm}(z)$, said matrix being defined by the following equation having, as KL×L elements, preprocessed signals $u_n(k), \ldots, u_n(k+L-1)$ at contiguous L time points starting at each of $k=1, \ldots, KL$ is defined by the following equation:

$$B_n \equiv \begin{bmatrix} u_n(1) & \ldots & u_n(L) \\ \vdots & & \vdots \\ \vdots & & \vdots \\ u_n(KL) & \ldots & u_n(KL+L-1) \end{bmatrix}$$

where L is the number of taps of the impulse responses indicative of said transfer characteristics $H_{nm}^T(z)$, and $h_{nm}^T$ and $u_n^T(k)$ are said impulse vectors of said transfer characteristics $H_{nm}(z)$ and preprocessed signal vectors defined by the following equations, respectively, $$h_{nm}^T = h_{nm}(L-1), \ldots, h_{nm}(0)]$$

$$u_n^T(k)=[u_n(k-L+1), \ldots, u_n(k)]$$

where: $n=1, \ldots, N$.

20. The medium of claim 19, which estimates the transfer characteristics of said linear FIR system by solving simultaneous equations defined by the following equation obtained by multiplying both sides of said simultaneous linear equations by a matrix $[B_1^T, \ldots, B_N^T]^T$ to correlate input signal components on its left-hand side $$\begin{bmatrix} B_1^T B_1 & B_1^T B_2 & \ldots & B_1^T B_N \\ B_2^T B_1 & B_2^T B_2 & \ldots & B_2^T B_N \\ \vdots & \vdots & \ddots & \vdots \\ B_N^T B_1 & \ldots & \ldots & B_N^T B_N \end{bmatrix}\begin{bmatrix} h_{1m} \\ \vdots \\ \vdots \\ h_{Nm} \end{bmatrix} = \begin{bmatrix} B_1^T \\ \vdots \\ \vdots \\ B_N^T \end{bmatrix}\begin{bmatrix} y_m(1) \\ \vdots \\ \vdots \\ y_m(KL) \end{bmatrix}.$$

21. The medium of any one of claims 15 through 20, wherein said linear FIR system is an acoustic hall, said N actuators are N loudspeakers, and said M sensors are M microphones.

* * * * *